(12) United States Patent
Domoto et al.

(10) Patent No.: US 6,354,008 B1
(45) Date of Patent: *Mar. 12, 2002

(54) SLIDING MEMBER, INNER AND OUTER BLADES OF AN ELECTRIC SHAVER AND FILM-FORMING METHOD

(75) Inventors: Yoichi Domoto, Ikoma; Hitoshi Hirano, Nishinomiya; Keiichi Kuramoto, Kadoma, all of (JP)

(73) Assignee: Sanyo Electric Co., Inc., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/156,825

(22) Filed: Sep. 21, 1998

(30) Foreign Application Priority Data

Sep. 22, 1997 (JP) ................................ 9-256986
Sep. 25, 1997 (JP) ................................ 9-259834
Aug. 25, 1998 (JP) .............................. 10-238173

(51) Int. Cl.$^7$ .............................................. B26B 19/04
(52) U.S. Cl. ................................. 30/346.53; 30/346.51
(58) Field of Search ........................ 30/346.51, 346.54, 30/346.58, 350, 346.53; 76/115, 116, 104.1, DIG. 8

(56) References Cited

U.S. PATENT DOCUMENTS

| | | | | |
|---|---|---|---|---|
| 3,064,349 A | * | 11/1962 | Futterer et al. | 30/346.51 |
| 3,161,955 A | * | 12/1964 | Cronin | 30/346.51 |
| 3,409,984 A | * | 11/1968 | Futterer | 30/346.51 |
| 3,611,572 A | * | 10/1971 | Futterer | 30/346.51 |
| 3,643,330 A | * | 2/1972 | Brown | 30/346.51 |
| 3,837,896 A | * | 9/1974 | Lindstrom et al. | 30/346.53 |
| 4,056,992 A | * | 11/1977 | Blume | 30/346.51 |
| 4,839,195 A | * | 6/1989 | Kitamura et al. | |
| 5,488,774 A | * | 2/1996 | Janowski | 30/346.53 |
| 5,497,550 A | * | 3/1996 | Trotta et al. | 30/346.53 |
| 5,857,260 A | * | 1/1999 | Yamada et al. | 30/346.51 |
| 5,940,975 A | * | 8/1999 | Decker et al. | 30/346.54 |

FOREIGN PATENT DOCUMENTS

| | | | | |
|---|---|---|---|---|
| DE | 3047888 | * | 7/1982 | 30/346.54 |
| DE | 3406521 | * | 8/1985 | 30/346.51 |
| DE | 3533238 | * | 3/1987 | 30/346.51 |
| EP | 0 828 015 A2 | | 3/1998 | |
| JP | 61-048392 A | | 3/1986 | |
| JP | 2-68091 | * | 3/1990 | 30/350 |
| JP | 2-144087 | * | 6/1990 | 30/346.54 |
| JP | 5-253359 | * | 10/1993 | 30/350 |

* cited by examiner

*Primary Examiner*—Hwei-Siu Payer
(74) *Attorney, Agent, or Firm*—Arent Fox Kintner Plotkin & Kahn, PLLC

(57) ABSTRACT

A sliding member having a sliding surface for sliding contact with a cooperative member is disclosed. A protective film is deposited not only on the sliding surface but also a surface region immediately adjacent the sliding surface such that a ratio d1/d2 is controlled to be 1 or greater, where d1 is a thickness of the protective film on the sliding surface and d2 is a thickness of the protective film on the surface region immediately adjacent the sliding surface. Alternatively, the protective film is deposited at least on the sliding surface such that the protective film is varied in thickness to define an irregular top surface.

5 Claims, 25 Drawing Sheets

53a 53b

DEPTH FROM A FILM SURFACE

SLIDING MEMBER, INNER AND OUTER BLADES OF AN ELECTRIC SHAVER AND FILM-FORMING METHOD

BACKGROUND OF THE INVENTION

1. Field of the Invention

The present invention relates to sliding members having a sliding surface for sliding contact with a cooperative member, such as inner and outer blades of an electric shaver, compressor parts, VTR parts and thin film magnetic heads. The present invention further relates to a method of forming a film on a substrate by utilizing a CVD method.

2. Description of Related Art

Investigations have been made as to the formation of a protective film, such as a nitride or diamond-like carbon film, on a skin-contacting, outer surface of an outer blade of an electric shaver, which can impart improved wear-resistance thereto. However, the formation of protective film on an inner surface of the outer blade, which is brought into contact with an inner blade of the electric shaver, has not been put into general practice up to date. Likewise, the formation of protective film on an sliding surface of a distal edge of the inner blade of electric shaver, which is brought into contact with the outer blade, has not been put into general practice up to date.

The inventors of the present application have investigated to what extent wear-resistance can be improved by providing a protective film, such as a diamond-like carbon film, on a sliding surface of an inner or outer blade of an electric shaver, and found that such formation of protective film on the sliding surface results in delamination thereof from the sliding surface or in cutout thereof at the edges of sliding surface, which causes wear of the sliding surface.

Such occurrence of delamination or cutout of the protective film is not limited to the cases where it is applied to the inner or outer blade of an electric shaver, and can also be found in the cases where it is applied onto sliding surfaces, such as of sliding parts of compressor, sliding members of VTR and thin film magnetic heads.

For these sliding members, a protective film is sought which exhibits reduced amount of wear and excellent sliding characteristics.

A plasma CVD method, which deposits a film by decomposing a source gas in a plasma, has been widely used as a measure of forming a film at a relatively low temperature, and is capable of forming films having various compositions by suitably selecting the source gas. Such a CVD method can be utilized to form various films, such as diamond-like carbon films having high degrees of hardness, carbon nitride (CN) and carbon silicide (CSi) films respectively having low levels of friction coefficient.

For example, a diamond-like carbon film, when formed on a silicon substrate, shows a good adhesion to the silicon substrate. However, when attempted to form a carbon nitride or carbon silicide film on the silicon substrate by using conventional film-forming techniques, there arises a problem of poor adhesion therebetween.

SUMMARY OF THE INVENTION

A first object of the present invention is to prevent delamination or cutout of a protective film provided on a sliding surface of a sliding member.

A second object of the present invention is to provide a sliding member carrying on its sliding surface a protective film which exhibits a reduced level of wear and is excellent in sliding characteristics.

A third object of the present invention is to provide a method of forming a film which is as highly functional as a carbon nitride or carbon silicide film and which exhibits good adhesion to a substrate by utilizing a plasma CVD method.

A sliding member in accordance with a first aspect of the present invention is the sliding member having a sliding surface for sliding contact with a cooperative member. A protective film is deposited over the sliding surface and a surface region immediately adjacent the sliding surface in such a characteristic manner that a ratio d1/d2 is controlled to be less than 1, wherein d1 is a thickness of the protective film overlying the sliding surface and d2 is a thickness of the protective film overlying the surface region immediately adjacent the sliding surface.

In a first preferred embodiment according to the first aspect of the present invention, the sliding member is an inner blade of an electric shaver. That is, the electric shaver inner blade of this embodiment has at its distal end a sliding surface for sliding contact with an outer blade of the electric shaver. A protective film is deposited not only on the sliding surface but also on side regions of the inner blade immediately adjacent the sliding surface, in such a characteristic manner that a ratio d1/d2 is controlled to be not less than 1, wherein d1 is a thickness of the protective film overlying the sliding surface and d2 is a thickness of the protective film overlying the side regions.

In a second preferred embodiment according to the first aspect of the present invention, the sliding member is an outer blade of an electric shaver. That is, the electric shaver outer blade of this embodiment defines a sliding surface, which is brought into sliding contact with an electric shaver inner blade, on its inner surface region around a hole for catching the beard. The outer blade carries the protective film not only on its sliding surface but also on an outer surface region around the hole in such a characteristic manner that a ratio d1/d2 is controlled to be not less than 1, wherein d1 is a thickness of the protective film overlying the sliding surface and d2 is a thickness of the protective film overlying the outer surface region.

In the first aspect of the present invention, the region immediately adjacent the sliding surface refers to the region which extends from an edge of the sliding surface at least a distance corresponding in dimension to the thickness of the protective film overlying the sliding surface.

In the first aspect of the present invention, the aforementioned thickness ratio d1/d2 is not less than 1, as specified above, preferably in the range of 1.05~5.0, more preferably in the range of 1.1~3.3.

The deposition of the protective film not only on the sliding surface but also on the region immediately adjacent the sliding surface, in accordance with the first aspect of the present invention, effectively prevents the occurrence of delamination or cutout of the protective film. If the thickness d2 of protective film, either deposited on the side regions immediately adjacent the sliding surface of the electric shaver inner blade, or deposited on the outer surface region of the electric shaver outer blade around the hole for catching the beard, is controlled to fall within the above-specified range, the delamination or cutout of the protective film on the sliding surface of either member can be prevented, while either member can maintain its function as a sliding member.

In the first aspect of the present invention, the thickness ratio d1/d2 of the protective films is controlled to fall within the range as specified above. The thickness d1 of protective film on the sliding surface is suitably selected depending on the particular uses of sliding members, but is generally preferred to fall within the approximate range of 50 Å~10 μm.

In the first aspect of the present invention, the hardness of protective film is preferably not less than 1000 Hv, more preferably not less than 1500 Hv.

A sliding member in accordance with the second aspect of the present invention is the sliding member having a sliding surface for sliding contact with a cooperative member. The sliding member carries a protective film at least on its sliding surface. Characteristically, the protective film is varied in thickness to have projected and depressed portions which together define an irregular surface profile.

In the second aspect of the present invention, the projected and depressed portions of the protective film may be arranged in either regular or irregular pattern. For example, the projected and depressed portions of the protective film may be alternatingly arranged to provide a striped pattern on the surface of the protective film.

In the second aspect of the present invention, the difference in height between the neighboring projected and depressed portions is not particularly specified, but may be in the range of 100~1000 Å. In a particular case where the electric shaver outer blade is selected as the sliding member, a center distance between the neighboring projected and depressed portions of the protective film may be about 1~3 mm, for example.

In the second aspect of the present invention, the different color tones can be imparted to the projected and depressed portions of the protective film by using as the protective film a transparent film which, due to optical interference, assumes different color tones depending on its thickness. The wear of protective film generally progresses at its projected portions brought into direct contact with a cooperative member. As these projected portions wear to get thinner, their color tone is caused to change. Accordingly, the degree of wear of the protective film can be identified by visually observing the change in color tone of such projected portions. This helps us to find the time to replace the sliding member, for example.

The second aspect of the present invention may incorporate the first aspect of the present invention. That is, when the protective film is deposited not only on the sliding surface but also on the region immediately adjacent the sliding surface, the thickness ratio d1/d2 may be controlled to be not less than 1 wherein d1 is the thickness of the protective film on the sliding surface and d2 is the thickness of the protective film on the region immediately adjacent the sliding surface. In this instance, the irregular surface profile may be imparted at least to the protective film on the sliding surface.

In the following description, the matters common to the first and second aspects of the present invention may be referred to as those of "the present invention".

Exemplary of the protective film are hard carbon films comprised of diamond and/or amorphous carbon having a diamond structure, and ceramic films.

Specific examples of the hard carbon films include a crystalline diamond film, an amorphous diamond-like carbon film and a diamond-like carbon film partly containing a crystalline structure. The hard carbon film of the present invention may contain the other elements, such as nitrogen and Si, in a mixed fashion.

Examples of the ceramics for use in the protective film of the present invention include oxides, nitrides and carbides of Zr, Ti, Cr, Hf, B, C, Ta, Al and Si.

Other than the aforementioned hard carbon films and ceramic films, metal films such as of Cr and Ni can also be used for the protective film. Such metal films can be formed by plating, for example.

The protective film of the present invention can be formed as by an ECR plasma CVD method and an ion beam deposition method. Other applicable methods include sputtering methods, the other types of PVD and CVD methods, and plating.

The protective film of the present invention may be deposited on an interlayer which has been deposited to cover the sliding surface and the surface region immediately adjacent the sliding surface of the sliding member. The thickness of the interlayer on the sliding surface is preferably made about comparable to that on the surface region immediately adjacent the sliding surface. However, they may be differentiated from each other. The thickness of the interlayer is preferably in the approximate range of 50 Å~8000 Å.

The sliding member of the present invention is illustrated as the electric shaver inner blade in the first embodiment and as the electric shaver outer blade in the second embodiment. However, the sliding member of the present invention can also be applied to the other sliding members, e.g., parts of a compressor such as a rotary compressor. Specifically, the present invention can be applied to rotary compressor parts including a roller, cylinder, vane, and a member having channels for receiving the cylinder. The present invention is also applicable to sliding parts of a VTR, and a thin film magnetic head for use in a hard disk drive (HDD). The present invention is further applicable to a sliding member such as a mask screen which is used to locate a solder at a target position when electronic parts are mounted on a printed circuit board.

The material type of the sliding member in the present invention is not particularly limited, and may be stainless steel, iron-based alloys, cast irons (Mo—Ni—Cr cast iron), steel (high-speed tool steel), aluminum alloys, carbons (aluminum-impregnated carbons), ceramics (oxides, nitrides, or carbides of Ti, Al, Zr, Si, W and Mo), Ni alloys, Ti alloys, or super hard alloys (WC, TiC, or BN), for example.

A method in accordance with a third aspect of the present invention is the method which deposits a film having a thickness varied in a manner to define an irregular surface by using a CVD technique. This method is characterized as comprising the steps of providing a distribution of lines of magnetic force above the substrate, and depositing the film on the substrate so that the film is varied in thickness in a pattern corresponding to the distribution of lines of magnetic force to define said irregular surface.

Although not intended to limit the scope of the present invention, the method in accordance with the third aspect of the present invention may be employed to form the protective film of the sliding member in accordance with the second aspect of the present invention.

In the third aspect of the present invention, the distribution of lines of magnetic force can be produced above the substrate by using various techniques. For example, it can be produced by placing a magnet beneath the substrate. In this instance, the substrate, if magnetic, can be fixed in position by the magnet.

A method in accordance with a fourth aspect of the present invention is also the method which deposits a film having a thickness varied in a manner to define an irregular surface by using a CVD technique. This method is characterized as comprising the steps of depositing a first film on selected regions of a substrate, and depositing a second film over an entire surface of the substrate carrying the first film so that a film comprising the first and second films can be produced which is varied in thickness to have relatively thick portions corresponding in location to said selected regions for defining said irregular surface.

Although not intended to limit the scope of the present invention, the method in accordance with the fourth aspect of the present invention may be employed to form the protective film of the sliding member in accordance with the second aspect of the present invention.

In the fourth aspect of the present invention, the deposition of first film on the selected-regions of the substrate can be accomplished, for example, by using a mask which functions to confine the deposition of first film on the selected regions of the substrate.

Examples of the film deposited in accordance with the third and fourth aspects of the present invention include hard carbon films comprised of diamond and/or amorphous carbon having a diamond structure, and ceramic films.

A method in accordance with a fifth aspect of the present invention is the method which deposit a film on a substrate by a CVD technique utilizing a plasma. The method includes the steps of decomposing a source gas in a plasma to deposit a first film layer on the substrate, and directing ions or radicals onto the substrate, while decomposing the source gas in the plasma, to deposit a second film layer on the first film layer to thereby provide the film on the substrate.

In the fifth aspect of the present invention, the ions or radicals for use in the deposition of the second film layer may generally be of an element different in type from a principal constituent element of the source gas. If contemplated forming the first and second film layers respectively from a carbon film and a carbon nitride or carbon silicide film, for example, a gas comprised principally of carbon, such as a $CH_4$ gas, may generally be used as the source gas and the ions or radicals of silicon or nitrogen may be directed onto the substrate. However, the ions or radicals for use in the deposition of the second film layer may be of the same element as principally constituting the source gas.

In the fifth aspect of the present invention, the applicable source gases, other than the gas comprised principally of carbon, include the gases which, as a principal component, contains silicon, titanium, zirconium, boron, hafnium, or aluminum. The applicable ions or radicals for use in the deposition of the second film layer, other than the aforementioned ions or radicals of silicon and nitrogen, include those of carbon, oxygen and hydrogen.

In accordance with the fifth aspect of the present invention, the first film layer may be made from a film which is well-adherent to the substrate, and the second film layer may be made from a film, such as a carbon nitride or carbon silicide film, which is poorly-adherent to the substrate but has desired functions. Accordingly, the deposition of such a functional, second film layer on the substrate, through the first film layer, results in the formation of a functional film showing good adhesion to the substrate.

In the film-forming method in accordance with the fifth aspect of the present invention, during the formation of the second film layer, the irradiation energy and dose of ions or radicals may be varied with film-forming time. Such variations in irradiation energy and dose of ions or radicals are effective to cause the distribution of the ion or radical component introduced into the second film layer to be varied in a thickness direction of the second film layer.

By reducing the irradiation energy of ions or radicals with film-forming time and increasing the irradiation dose of ions or radicals with film-forming time, a concentration of the ion or radical component introduced into the second film layer can be increased toward its surface so that a concentration gradient of the component is produced in the thickness direction of the second film layer.

The introduction of such a concentration gradient of the component into the second film layer imparts the improved function to the surface of the second film layer. The second film layer, if made from a carbon nitride or carbon silicide film, exhibits the reduced coefficient of friction toward its surface. The provision of the concentration gradient also results in the formation of a film which exhibits the improved adhesion to a substrate and is imparted thereto the satisfactory functions.

A film-forming method in accordance with a sixth aspect of the present invention is the method of depositing a film on a substrate by a CVD technique utilizing a plasma, and includes the steps of decomposing a source gas in a plasma to thereby deposit a first film layer on a substrate; and applying a radio-frequency power to the substrate for producing a substrate bias voltage (self-bias voltage) and concurrently irradiating the substrate with ions or radicals, while the source gas is decomposed in the plasma, to thereby deposit a second film layer on the first film layer.

In the sixth aspect of the present invention, the ions or radicals for use in the deposition of the second film layer may generally be of an element different in type from a principal constituent element of the source gas. If contemplated forming the first and second film layers respectively from a carbon film and a carbon nitride or carbon silicide film, for example, a gas comprised principally of carbon, such as a $CH_4$ gas, may generally be used as the source gas and the ions or radicals of silicon or nitrogen may be directed onto the substrate. However, the ions or radicals for use in the deposition of the second film layer may be of the same element as principally constituting the source gas.

In the sixth aspect of the present invention, the applicable source gases, other than the gas comprised principally of carbon, include the gases which contains, as a principal component, silicon, titanium, zirconium, boron, hafnium, or aluminum. The applicable ions or radicals for use in the deposition of the second film layer, other than the aforementioned ions or radicals of silicon and nitrogen, include those of carbon, oxygen and hydrogen.

In accordance with the sixth aspect of the present invention, the first film layer may be made from a film which is well-adherent to the substrate, and the second film may be made from a film, such as a carbon nitride or carbon silicide film, which is poorly-adherent to the substrate but has desired functions. Accordingly, the deposition of such a functional, second film on the substrate, through the first film, results in the formation of a functional film showing good adhesion to the substrate.

Also in the film-forming method in accordance with the sixth aspect of the present invention, during the formation of the second film layer, the irradiation energy and dose of ions or radicals, as well as the substrate bias voltage, may be varied with film-forming time. Such variations in irradiation energy of ions or radicals and the others are effective to cause the distribution of the ion or radical component introduced into the second film layer to be varied in a thickness direction of the second film layer.

By reducing the irradiation energy of ions or radicals and the substrate bias voltage with film-forming time and increasing the irradiation dose of ions or radicals with film-forming time, a concentration of the ion or radical component introduced into the second film layer can be increased toward its surface so that a concentration gradient of the component is produced in the thickness direction of the second film layer.

The introduction of such a concentration gradient of the component into the second film layer imparts the improved function to the surface of the second film layer. The second film layer, if made from a carbon nitride or carbon silicide film, exhibits the reduced coefficient of friction toward its surface. The provision of the concentration gradient also results in the formation of a film which exhibits the improved adhesion to a substrate and is imparted thereto the satisfactory functions.

In the sixth aspect of the present invention, the application of radio-frequency power to the substrate causes the production of negative bias voltage in the substrate, as stated above. Such a negative bias voltage, if produced, generally acts to attract positive ions to the substrate so that they are preferentially introduced into the second film layer. Accordingly, in the sixth aspect of the present invention, those positive ions, if directed onto the substrate during the deposition of second film layer, are preferentially incorporated into the second film layer.

Also in the sixth aspect of the present invention, the radio-frequency power may be applied to the substrate to produce the substrate bias voltage during the deposition of first film layer on the substrate.

A film-forming method in accordance with a seventh aspect of the present invention is the method of depositing a film on a substrate by a CVD technique utilizing a plasma, and includes the steps of decomposing a source gas in a plasma to thereby deposit a first film layer on a substrate, and decomposing the source gas, as well as a second source gas which contains an element different in type from a principal constituent element of the source gas, in the plasma to thereby deposit a second film layer on the first film layer.

In the seventh aspect of the present invention, the second film layer can be formed which contains the element different in type from the constituent component of the first film layer, by decomposing the source gas and the second source gas in the plasma. It accordingly becomes possible, for example, to form a carbon-based film as the first film layer and subsequently form a film containing an element other than carbon, such as a carbon nitride or carbon silicide film, as the second film layer. In this exemplary case, the second source gas contains nitrogen or silicon.

In the seventh aspect of the present invention, the source gas may be varied in amount with film-forming time. Such a variation in amount of the second source gas with film-forming time leads to the varied distribution in concentration of the element contained in the second source gas in a thickness direction of the second film layer. For example, the increase in amount of the second source gas results in the formation of the second film layer which has an increased concentration of the element contained in the second source gas toward its surface so that a concentration gradient thereof is produced in the thickness direction of the second film layer.

The films of the present invention can be formed by using the film-forming methods in accordance with the aforementioned fifth, sixth and seventh aspects of the present invention. That is, the film of the present invention includes the first film layer comprised of a hard carbon film, and the second film layer deposited on the first film layer and containing nitrogen or silicon as well as the constituent component of the first film layer.

In the aforementioned fifth, sixth and seventh aspects of the present invention, the film of the present invention can be obtained by forming a hard carbon film as the first film layer and subsequently forming a carbon film containing nitrogen or silicon as the second film layer.

In forming the film of the present invention, a carbon-containing gas, such as a methane gas, may be used. In the fifth and sixth aspects of the present invention, ions or radicals of nitrogen or silicon may be directed onto the substrate. In the seventh aspect of the present invention, a gas containing nitrogen or silicon may be used as the second source gas.

In the present invention, the hard carbon film for constituting the first film layer may be a crystalline diamond film, an amorphous diamond-like carbon film, or a diamond-like carbon film partly having a crystalline structure.

In the film of the present invention, the thicknesses of the first and second film layers are not particularly specified. Although not limiting, the thickness of the first film layer is generally in the range of 20 Å~3000 Å, and the thickness of the second film layer is generally in the range of 30 Å~4 $\mu$m (40,000 Å).

The nitrogen or silicon content of the second film layer is preferably in the approximate range of 5~40 atomic %.

The concentration of nitrogen or silicon in the second film layer may be graded in a thickness direction thereof. In the preferred embodiment, the second film layer has such a concentration gradient in its thickness direction that the concentration of nitrogen or silicon is increased toward a surface of the second film layer.

The films formed by using the film-forming methods in accordance with the fifth through seventh aspects of the present invention, as well as the films in accordance with the present invention, may further have an interlayer interposed between the first film layer and the substrate. Such an interlayer may be formed of Si, Ti, Zr, W, Mo, Ru or Ge, or an oxide, nitride or carbide of any of thereof, for example. The interlayer can be formed by using generally-employed film-forming techniques. A magnetron RF sputtering technique, for example, can be utilized to form the interlayer. Such a sputtering technique generally uses the aforementioned metal element as a target which is sputtered by ions in argon plasmas to deposit a film. The sputtering, if accompanied by the introduction of an oxygen or nitrogen gas into a chamber, can deposit an oxide or nitride of the metal element as the interlayer. The sputtering, if accompanied by the introduction of a carbon-containing gas, such as a $CH_4$ gas, into the chamber, can deposit a carbide of the metal element as the interlayer.

The thickness of the interlayer may be in the approximate range of 20 Å~3000 Å, for example.

DESCRIPTION OF THE PREFERRED EMBODIMENTS

Figure 1:
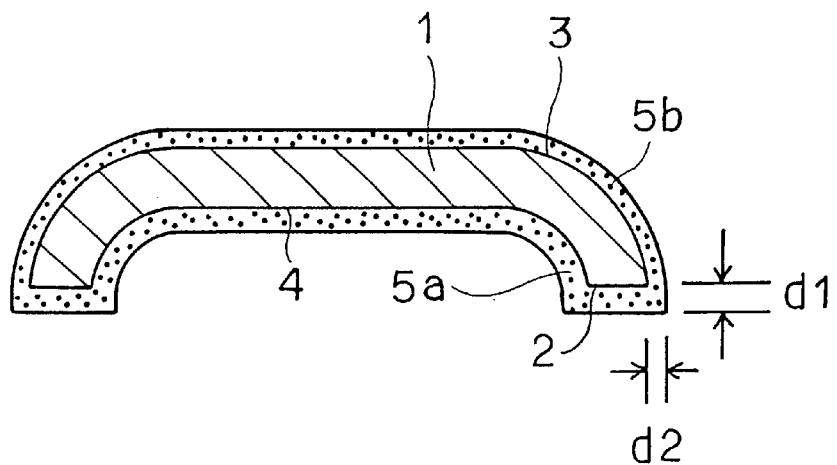
FIG. 1 is a sectional view of one embodiment of an electric shaver outer blade in accordance with the first aspect of the present invention.
Figure 2:
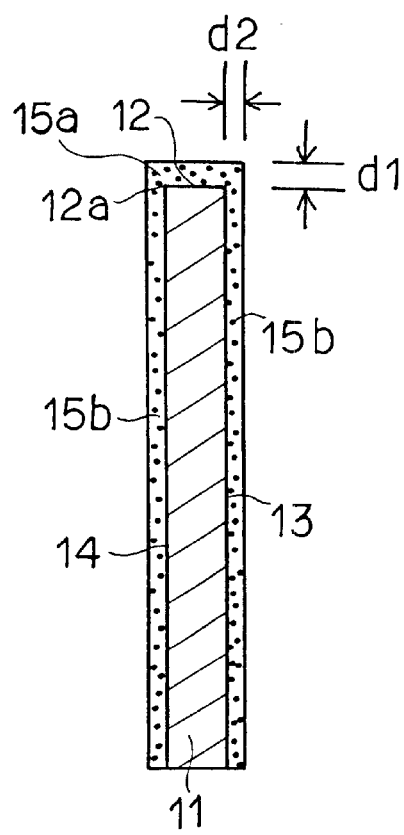
FIG. 2 is a sectional view of one embodiment of an electric shaver inner blade in accordance with the first aspect of the present invention.
Figure 3:
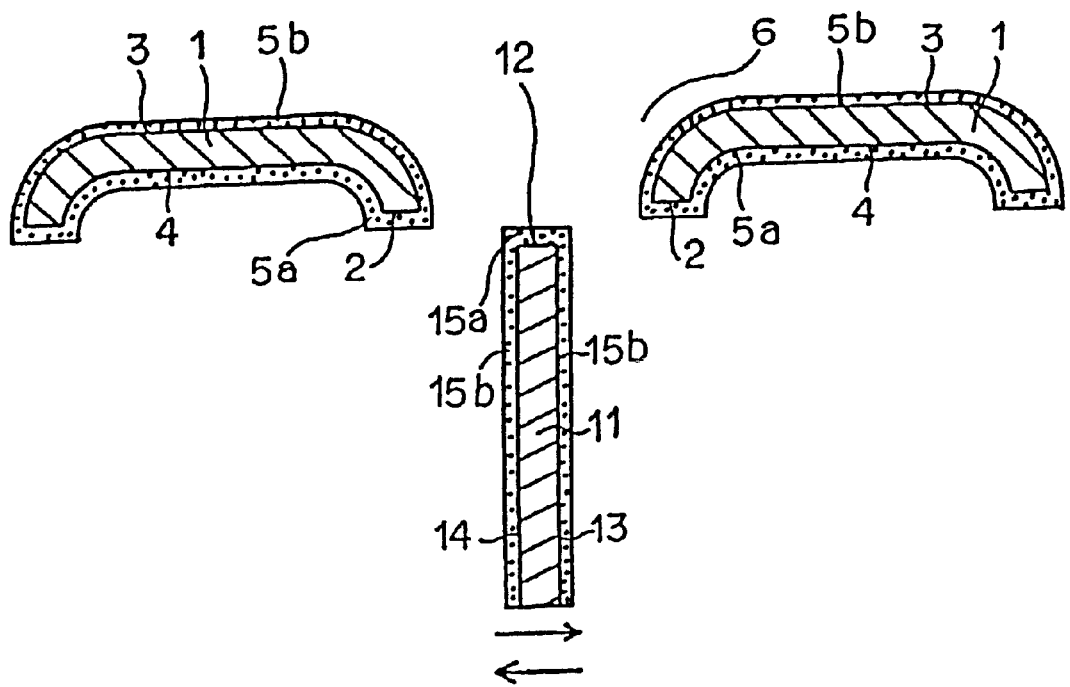
FIG. 3 is a sectional view showing a set of the electric shaver outer blade shown in FIG. 1 and the electric shaver inner blade shown in FIG. 2.

FIGS. 1 through 3 are sectional views showing inner and outer blades of an electric shaver, each as a sliding member in accordance with the first aspect of the present invention. FIG. 1 shows the electric shaver outer blade and FIG. 2 shows the electric shaver inner blade. FIG. 3 is a sectional view showing the positional arrangement of the electric shaver outer blade relative to the electric shaver inner blade. As shown in FIG. 3, the electric shaver inner blade 11 is disposed inwardly of the electric shaver outer blade 1. The electric shaver inner blade 11, when operated to move to and fro in the direction indicated by the arrows in FIG. 3, cuts off the beard caught in a hole 6 of the electric shaver outer blade 1. As also shown in FIG. 3, an inner surface portion of the outer blade 1 that extends to surround the hole 6 defines a sliding surface 2 for sliding contact with the electric shaver inner blade 11. A distal end of the electric shaver inner blade 11 also defines a sliding surface 12. The beard caught in the hole 6 of the electric shaver outer blade 1 is cut off by a shear force produced between an edge of the sliding surface 2 of the electric shaver outer blade 1 and an edge of the sliding surface 12 of the electric shaver inner blade 11.

Figure 4:
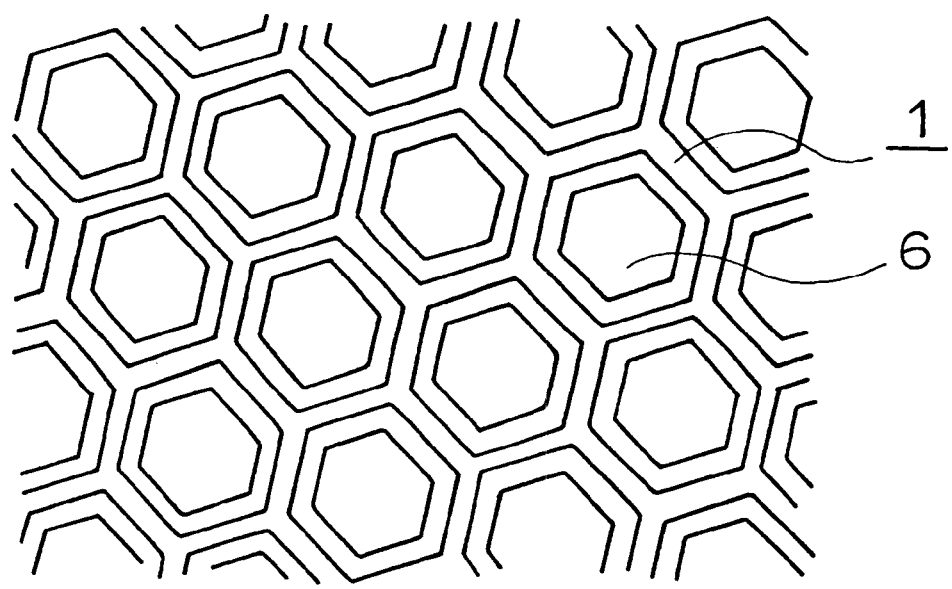
FIG. 4 is a plan view showing the shape of a hole provided in the electric shaver outer blade shown in FIG. 1.
Figure 5:
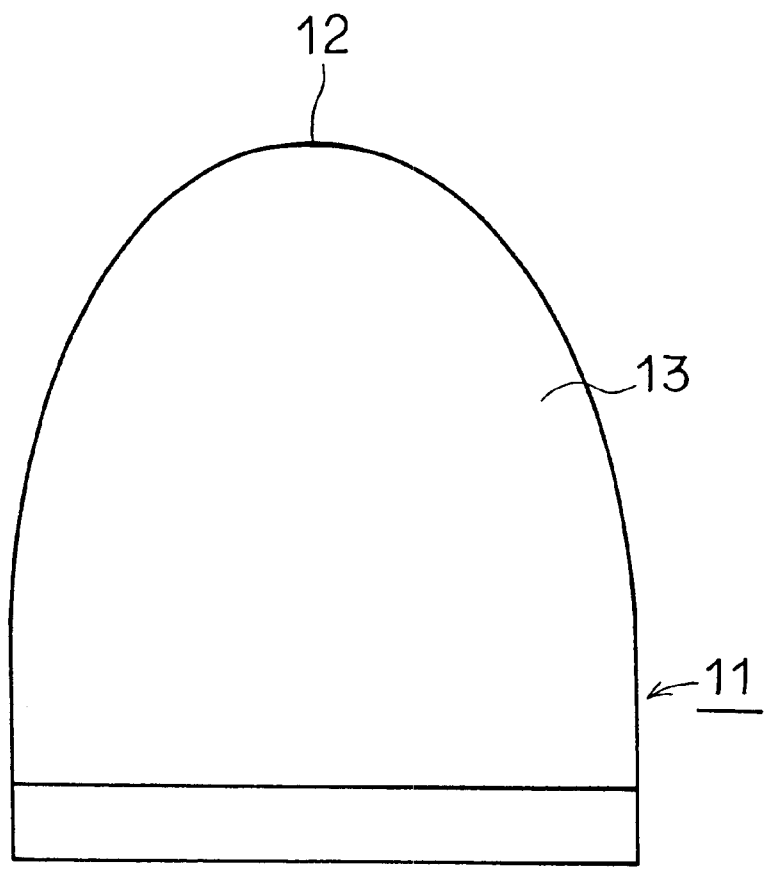
FIG. 5 is a side view showing the side of the electric shaver inner blade.

FIG. 4 is a plan view showing the shape of the holes 6 provided in the electric shaver outer blade 1. FIG. 5 is a side view showing the shape of one side of the electric shaver inner blade 11. As shown in FIG. 4, a number of holes 6 is provided in the electric shaver outer blade 1 for catching the beard. Also, the electric shaver outer blade 1 is formed from a soft material so that it can slidably receive the distal end, i.e., the sliding surface 12 of the electric shaver inner blade 11 shown in FIG. 5.

FIG. 1 is an enlarged sectional view of the electric shaver outer blade 1. As shown in FIG. 1, a protective film 5b is provided on an outer surface 3 of the electric shaver outer blade 1. Another protective film 5a is provided on an inner surface 4, including the sliding surface 2, of the electric shaver outer blade 1. As can be seen from FIG. 1, a thickness of the protective film 5b provided on the outer surface 3 is denoted by d2. A thickness of the protective film 5a provided on the inner surface 4 is denoted by d1. In the first aspect of the present invention, the protective films 5a and 5b are respectively provided such that the ratio d1/d2 is not less than 1, preferably in the range of 1.05~5.0, more preferably in the range of 1.1~3.3.

FIG. 2 is an enlarged sectional view of the electric shaver inner blade. As shown in FIG. 2, a protective film 15a is provided on a distal end, i.e., a sliding surface 12 of the electric shaver inner blade 11. The electric shaver inner blade 11 further carries protective films 15b on its sides 13 and 14. In this particular embodiment, the protective film 15b is deposited on opposing parallel sides 13 and 14 of the inner blade, which respectively cross a sliding direction thereof. As can be seen from FIG. 2, a thickness of the protective film 15a provided on the sliding surface 12 is denoted by d1, and a thickness of the protective film 15b provided on each of the sides 13 and 14 is denoted by d2. In the first aspect of the present invention, the protective films 15a and 15b are respectively provided such that the ratio d1/d2 is not less than 1, preferably in the range of 1.05~5.0, more preferably in the range of 1.1~3.3.

In the first aspect of the present invention, the protective film 5b may be provided to overly at least a limited region of the outer surface immediately adjacent or neighboring the sliding surface 2, although shown in FIG. 1 as being provided over an entire region of the outer surface 3. Accordingly, it should be understood that the protective film 5b may be provided only on the limited region of the outer surface 3 immediately adjacent the hole 6 shown in FIG. 3, for the electric shaver outer blade shown in FIG. 1.

Also in the first aspect of the present invention, its is necessary that the protective film 5a be provided to cover at least the sliding surface 2, although shown to cover an entire region of the inner surface 4 of the electric shaver outer blade 1 in the embodiment shown in FIGS. 1 and 3.

Further in the first aspect of the present invention, it is necessary that the protective film 15b be provided on the electric shaver inner blade 1 to cover at least a limited region of each side 13, 14 thereof that immediately neighbors the sliding surface 12, although shown to cover an entire region of each side 13, 14 in the embodiment shown in FIGS. 2 and 3. Accordingly, the protective film 15b may be provided to cover each side region that extends inwardly from the edge 15a a distance not smaller in dimension than the thickness d1 of the protective film 15a.

Figure 6:
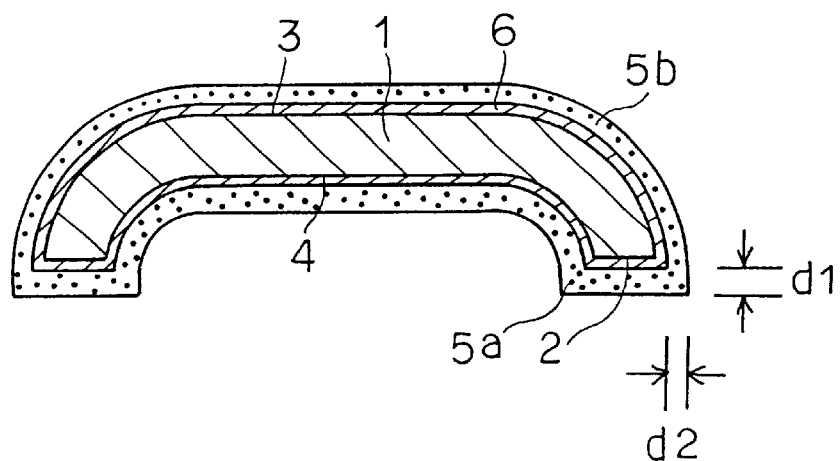
FIG. 6 is a sectional view of another embodiment of an electric shaver outer blade in accordance with the first aspect of the present invention.
Figure 7:
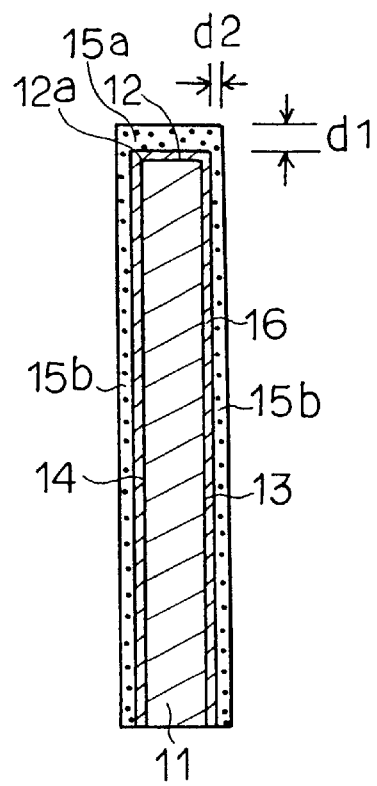
FIG. 7 is a sectional view of another embodiment of an electric shaver inner blade in accordance with the present invention.

FIGS. 6 and 7 are sectional views respectively showing further embodiments of outer and inner blades of an electric shaver in accordance with the first aspect of the present invention. FIG. 6 shows the electric shaver outer blade and FIG. 7 shows the electric shaver inner blade. In this particular embodiment, the electric shaver outer blade 1 carries thereon an interlayer 6 on which protective films 5a and 5b are formed, as shown in FIG. 6. Even in the case where the interlayer 6 is such provided, the thickness d1 of the protective film 5a provided on the sliding surface 2, as well as the thickness d2 of the protective film 5b provided on the region of outer surface 3 immediately adjacent the sliding surface 2, are adjusted to fall within the ranges specified in the first aspect of the present invention.

Likewise, the electric shaver inner blade 11 carries thereon an interlayer 16 on which protective films 15a and 15b, are provided, as shown in FIG. 7. Again, for this electric shaver inner blade, the thickness d1 of the protective film 15a provided on the sliding surface 12, as well as the thickness d2 of the protective film 15b provided on the region of each side 13 and 14 immediately neighboring the sliding surface 12, are adjusted to fall within the ranges specified in the first aspect of the present invention.

Figure 15:
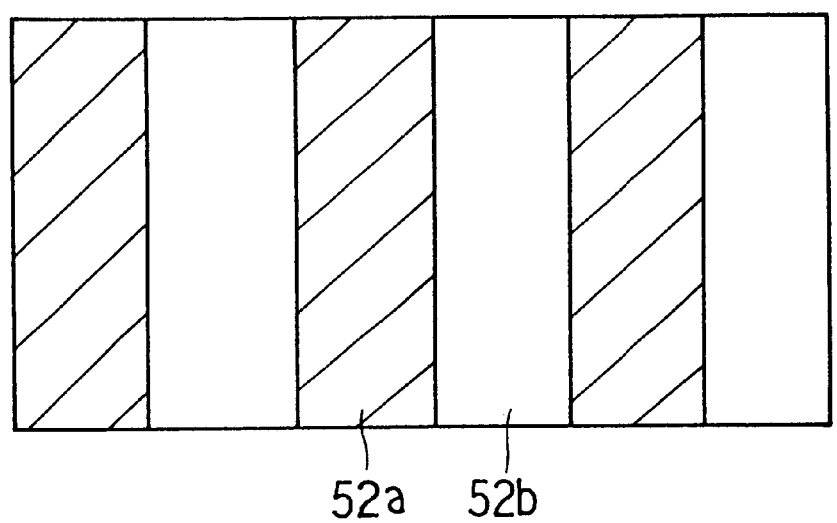
FIG. 15 is a plan view showing one embodiment of a protective film deposited on a sliding member in accordance with a second aspect of the present invention.
Figure 16:
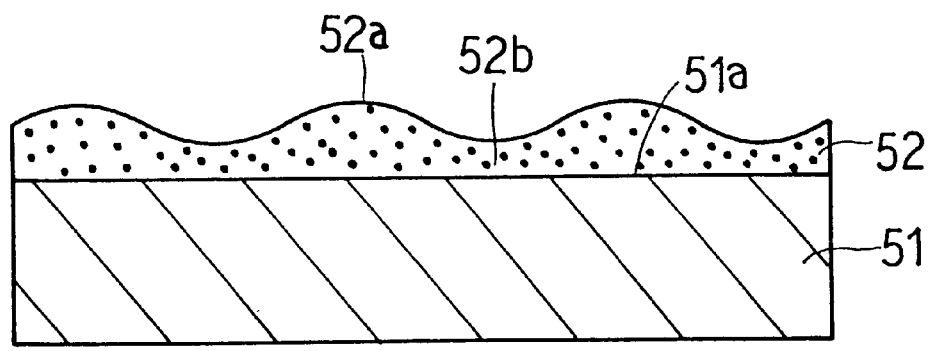
FIG. 16 is a sectional view showing the protective film of FIG. 15.

FIGS. 15 and 16 are views showing a protective film provided on a sliding surface of a sliding member in accordance with the second aspect of the present invention. FIGS. 15 and 16 are a plan view and a sectional view, respectively. As shown in FIG. 16, a protective film 52 is deposited on a sliding surface 51a of a sliding member 51. The protective film 52 includes relatively thick, projected portions 52a and relatively thin, depressed portions 52b, arranged in alternating and continuous fashions. As shown in FIG. 15, the projected portions 52a (indicated by crosshatching) and depressed portions 52b are such arranged to define a striped pattern.

The projected portions 52a of the protective film 52 shown in FIG. 16 are those portions that will be brought into sliding contact with a cooperative member. Such construction serves to reduce a contact area of the protective film with the cooperative member and is thus effective in reducing a frictional resistance and accordingly improving its wear resistance. Also, the progress of wear can be detected from change in color tone of the protective film 52, if it is formed from a transparent film which, due to optical interference, assumes different color tones depending on its thickness. That is, a degree of wear of the protective film 52 can be identified by visually observing the change of color tone at the projected portions 52a which, when contacted with a cooperative member, wears and reduces its thickness. For example, if the projected portions 52a present a color tone different from that of the depressed portions 52b, a striped pattern shown in FIG. 15 appears. As the wear progresses at the projected portions 52a to such an extent that they approximate in thickness to the depressed regions 52b, their respective color tones come closer to each other so that the striped pattern comes to disappear. Thus, the wear degree of the protective film 52 can be identified by visually observing such disappearance of the striped pattern. This suggests a timing for replacement of a sliding member, for example. Exemplary of the transparent film which, due to optical interference, assumes different color tones depending on its thickness is a diamond-like carbon film. As the diamond-like carbon film is gradually reduced in thickness, its color tone changes periodically in the sequence of "yellow", "red", "violet", "blue", "blue-green", "green" and "yellow".

The second aspect of the present invention may incorporate the aforementioned, first aspect of the present invention. In determining the thickness d1 of protective film on the sliding surface and of the thickness d2 of protective film on the region neighboring the sliding surface, the irregularities of the protective film are then averaged to obtain an average film thickness.

The protective film shown in FIGS. 15 and 16 as having a varying thickness can be formed, for example, by using the film-forming methods in accordance with the third and fourth aspects of the present invention.

Figure 17:
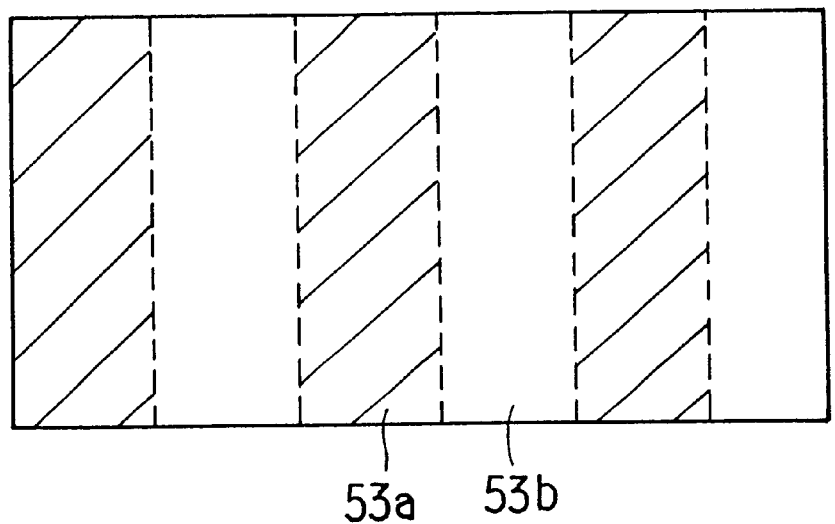
FIG. 17 is a plan view showing one example of magnet for use in a third aspect of the present invention.
Figure 18:
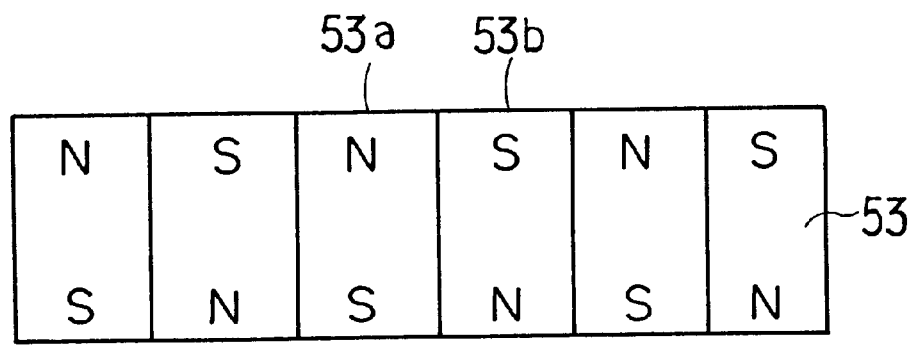
FIG. 18 is a sectional view showing the magnet of FIG. 17.

FIGS. 17 and 18 are views showing one example of a magnet which is employed in the film-forming method according to the third aspect of the present invention for providing a distribution of lines of magnetic force above a substrate. FIGS. 17 and 18 are a plan view and a sectional view, respectively. As shown in FIG. 18, a magnet 53 is magnetized to produce discrete regions wherein N- and S-poles of the discrete region are reversed in position in the neighboring discrete region. Accordingly, a set of the N-pole 53a and S-pole 53b is arranged in a repeated fashion on either side of the magnet to define a striped pattern, as shown in FIG. 17. The use of such a magnet 53 results in the formation of the protective film which includes relatively thick portions corresponding in location to the N-poles or S-poles and relatively thin portions corresponding in location to boundaries of the neighboring N- and S- poles. A plastic magnet may be employed as the aforementioned magnet 53, for example. Alternatively, a plurality of magnets or electromagnets may suitably be arranged to constitute the magnet 53.

Figure 19:
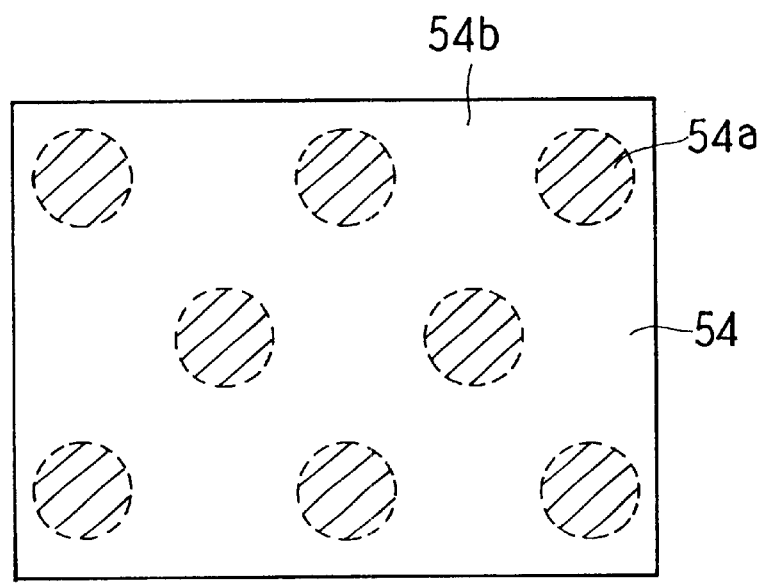
FIG. 19 is a plan view showing another example of magnet for use in the third aspect of the present invention.

FIG. 19 is a plan view showing another example of the magnet. In this magnet 54, N-poles 54a (or S-poles) are dispersed like islands within an S-pole 54b (or N-pole). The use of such a magnet enables formation of the protective film in which either the relative thick, projected portions or relatively thin, depressed portions are dispersed like islands.

The suitable positional arrangement of the N- and S-poles, in the manner as stated above, to make a desired design, pattern or character results in formation of the protective film having projected or depressed portions arranged in accordance with the desired design or the other.

Figure 20:
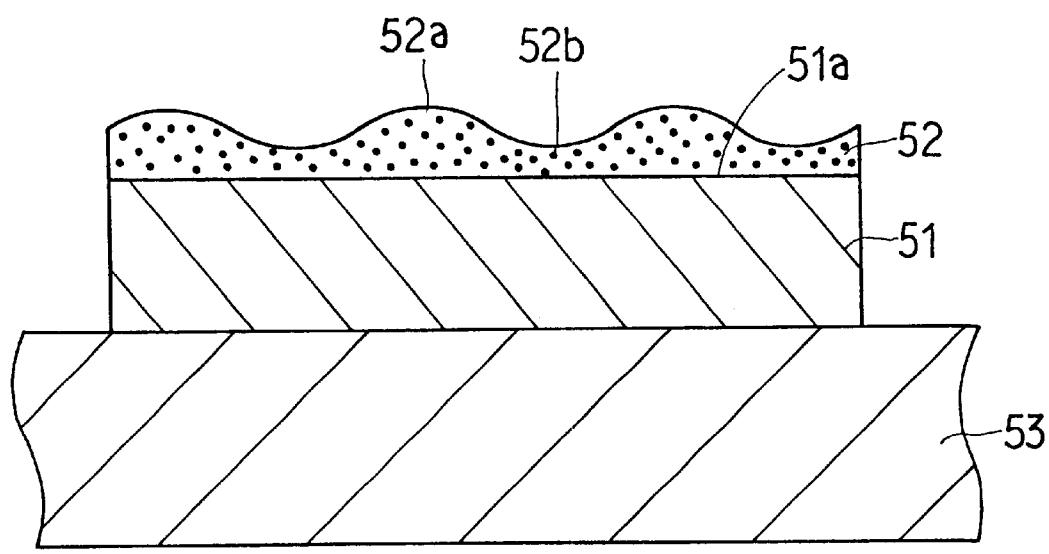
FIG. 20 is a sectional view showing one embodiment for practicing a film-forming method in accordance with the third aspect of the present invention.

FIG. 20 is a sectional view showing one embodiment for practicing a film-forming method in accordance with the third aspect of the present invention. As shown in FIG. 20, the magnet 51 is placed beneath a substrate, i.e., beneath the sliding member 51 to provide a desired distribution of lines of magnetic force above the substrate 51. When the protective film 52 is subsequently deposited on the substrate 51, irregularities are given thereto in a pattern corresponding to the distribution of lines of magnetic force. The protective film 52 can be formed which includes projected portions 52a and depressed portions 52b arranged in a striped pattern as shown in FIGS. 15 and 16, by utilizing the magnet having a surface on which N-poles and S-poles are distributed in a striped pattern, as shown in FIGS. 17 and 18. Specifically, the projected portions 52a can be formed corresponding in location to the N-poles or S-poles, while the depressed portions 52b can be formed corresponding in location to boundaries of the neighboring N- and S-poles.

Figure 21:
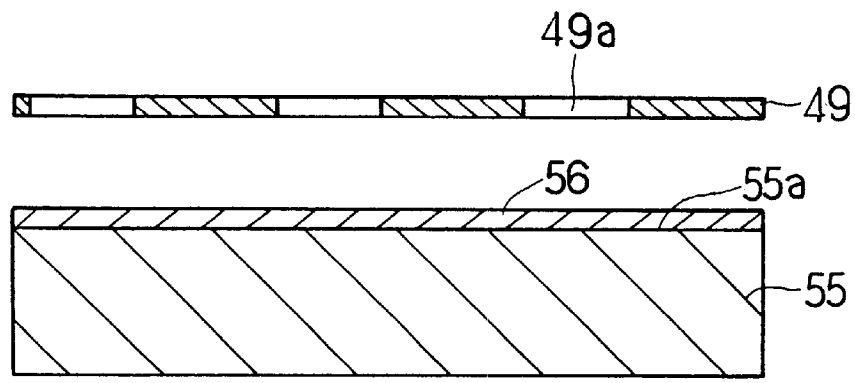
FIGS. 21 through 23 are sectional views showing one embodiment for practicing a film-forming method in accordance with a fourth aspect of the present invention.
Figure 22:
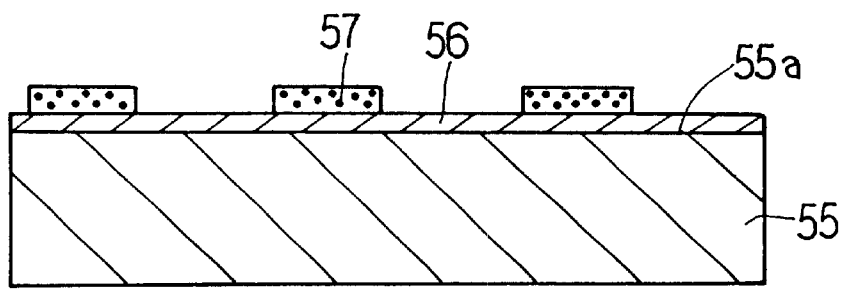
Figure 23:
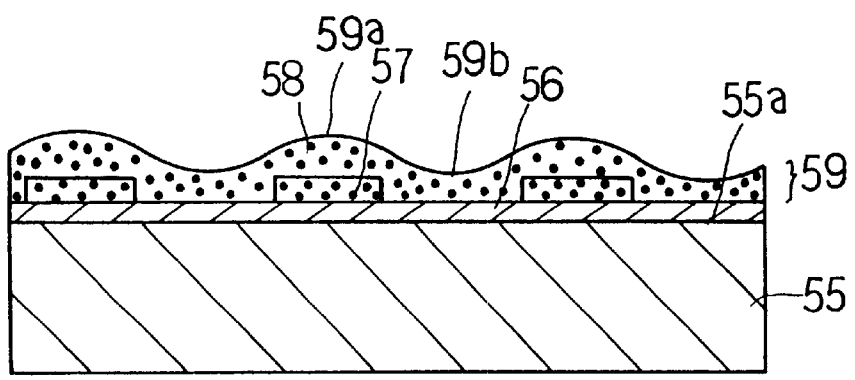

FIGS. 21 through 23 are sectional views showing one embodiment for practicing the film-forming method in accordance with the fourth aspect of the present invention.

Referring to FIG. 21, an interlayer 56 is deposited on a sliding surface 55a of a sliding member or substrate 55. Such an interlayer 56 can be formed of at least one type of material selected from Si, Zr, Ti, Ru, Ge and oxides, carbides and nitrides thereof. The interlayer can be interposed between the protective film and the sliding surface of sliding member, in the first and second aspects of the present invention. Also in the aforementioned third aspect of the present invention, the interlayer can be deposited on the substrate for subsequent provision of the protective film on the interlayer. The provision of the interlayer serves to improve adherence of the protective film to the sliding surface.

FIG. 21 shows a mask 49 disposed above the interlayer 56. The mask 49 has openings 49a provided at predetermined locations. A first protective film is to be deposited on the interlayer 56 through the mask 49.

FIG. 22 shows the first protective film 57 such deposited on the interlayer 56 through the mask 49.

A second protective film 58 is then deposited over an entire upper surface of the substrate 55. The first protective film 57 and the second protective film 58, formed in the manner as described above, together constitute a protective film 59. The protective film 59 has relatively thick, projected portions 59a at locations where the first protective films 57 reside, and relatively thin, depressed portions 59b at locations where the first protective films 57 are devoid. Accordingly, a protective film can be formed which has projected and depressed portions arranged in a striped pattern, analogous to the protective film 52 shown in FIGS. 15 and 16, for example, by providing a striped pattern of the first protective film 57. Also, a desired design, pattern or character can be given on the protective film, by providing the first protective film 57 at locations where relatively thick, projected portions are desired to be formed. Furthermore, such a design or the other can be given by different color tones, by using as the protective film a particular film which, due to optical interference, presents different color tones depending on its thickness.

A specific example of depositing a protective film on a sliding member in accordance with the first aspect of the present invention is described below.

Example of Depositing a Hard Carbon Film on an Electric Shaver Inner Blade

Figure 8:
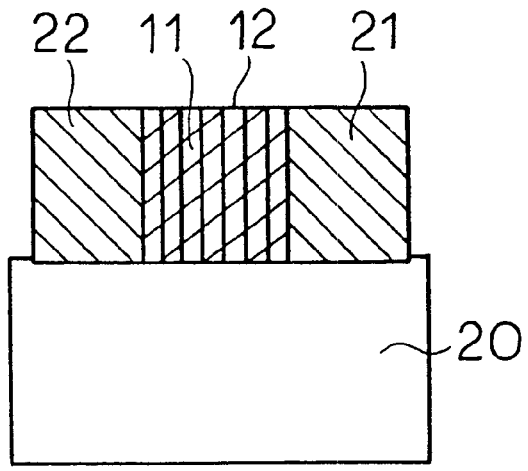
FIG. 8 is a side view showing a number of outer blades placed in position for film deposition on their respective sliding surfaces.

First, an Si interlayer was deposited on an electric shaver inner blade made of a stainless steel (SUS) by using a CVD method. In depositing a film on the sliding surface 12 of the electric shaver inner blade 11, the following procedure was followed. As shown in FIG. 8, plural electric shaver inner blades 11, arranged side by side on a holder 20, were flanked by a pair of jigs 21 and 22. Then, a film was deposited to cover all of the respective sliding surfaces 12 of the electric shaver inner blades.

In depositing a film on a side of the electric shaver inner blade 11, the following procedure was followed. The plural electric shaver inner blades 11 were arranged end to end on a holder 23 so as for one side 13 of each electric shaver inner blade 11 to face upward. Then, a film was deposited to cover all of the respective sides 13 of the electric shaver inner blades 11.

The Si interlayer was deposited on each of the sliding surface 12 and sides 13, 14 to a thickness of 500 Å.

Figure 9:
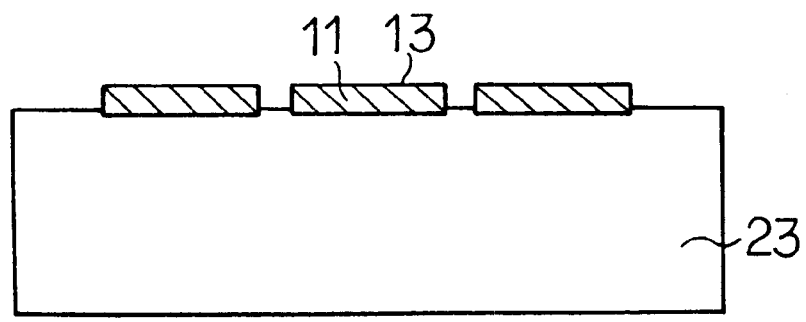
FIG. 9 is a side view showing a number of inner blades placed in position for film deposition on their respective sides.

Thereafter, a diamond-like carbon film was deposited on the interlayer of the electric shaver inner blade. The diamond-like carbon film was deposited, through the interlayer, not only on the sliding surface in the manner as shown in FIG. 8, but also on each side in the manner as shown in FIG. 9.

Figure 10:
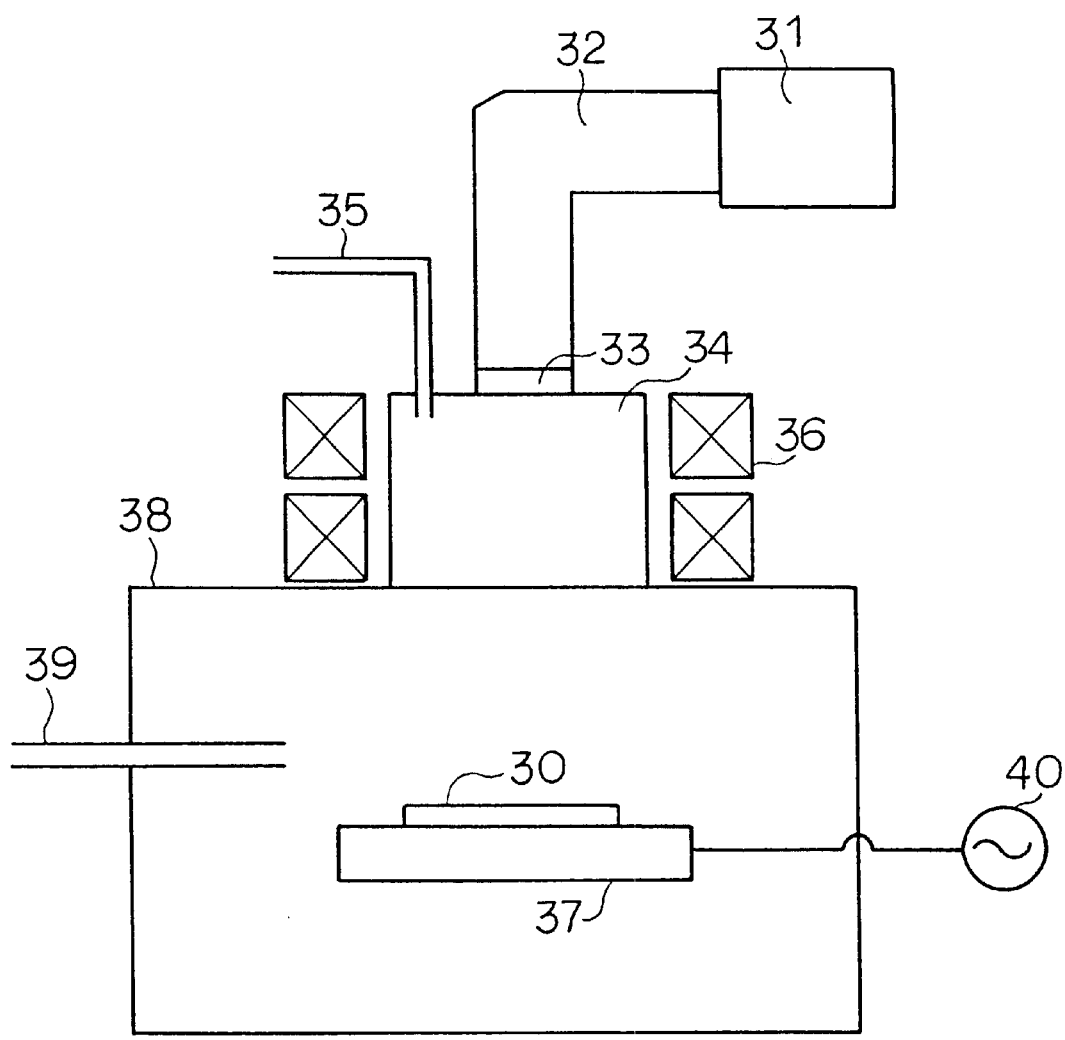
FIG. 10 is a schematic block diagram showing one example of an ECR plasma CVD apparatus.

FIG. 10 is a schematic sectional view showing an exemplary ECR plasma CVD apparatus for use in the formation of a diamond-like carbon film. Referring to FIG. 10, a vacuum chamber 38 has a plasma generation chamber 34 to which one end of a waveguide 32 is connected. Another end of the waveguide 32 is mounted to a microwave supplying means 31. A microwave generated in the microwave supplying means 31 passes through the waveguide 12 and a microwave inlet window 33 to be guide into the plasma generation chamber 34. The plasma generation chamber 34 is provided with a gas inlet line 35 for introducing a discharge gas such as an argon (Ar) gas thereinto. Also, a number of plasma magnetic field generators 36 is mounted around the plasma generation chamber 34. A high-density ECR plasma can be generated within the plasma generation chamber 34 through the interaction of a radio-frequency magnetic field produced by the microwave and a magnetic field produced by the plasma magnetic field generators 36.

The vacuum chamber 38 houses a holder 37 on which a sample piece 30 is placed for coverage with a diamond-like carbon film. The holder 37 is electrically connected to a radio-frequency power source 40. The application of an RF power from the radio-frequency power source 40 to the holder 37 causes the sample piece to generate a self-bias voltage. The vacuum chamber 38 is also provided with a source gas inlet line 39 for introducing thereinto a source gas, such as methane ($CH_4$) or hydrogen ($H_2$). The source gas, when introduced from the source gas inlet line 39, is decomposed by the action of a plasma from the plasma generation chamber 34, resulting in the deposition of a diamond-like carbon film on the sample piece 30.

The following film-forming conditions were employed: Ar gas partial pressure of $5.7 \times 10^{-4}$ Torr., CH4 gas partial pressure of $1.3 \times 10^{-3}$ Torr., microwave frequency of 2.45 GHz, and microwave power of 100 W. A 13.56 MHZ RF power from the radio-frequency power source 40 was applied to the holder in a controlled fashion so that a self-bias voltage of –50 V was generated at the sample piece 30.

First, a sample of electric shaver inner blade was fabricated which had a 2000 Å thick, diamond-like carbon film solely on its sliding surface 12. The sample inner blade of electric shaver was combined with an electric shaver outer blade, made of SUS, to set an electric shaver which was continuously operated for two weeks. Thereafter, the electric shaver inner blade was observed for a degree of wear. As a result, delamination or partial cutout of the diamond-like carbon film, as a protective film, was noticed at the edges 12a (see FIGS. 2 and 7) of the electric shaver inner blade 12 where its sliding surface 12 met respective sides 13 and 14.

Next, a protective film, i.e., a diamond-like film was deposited on each of a sliding surface and both sides of an electric shaver inner blade. In depositing the diamond-like carbon film on each side, its thickness was altered at 1000 Å, 2000 Å, and 3000 Å. As a result, three types of sample inner blades were fabricated. In the same manner as described above, each sample inner blade thus obtained was combined with an electric shaver outer blade, made of SUS, to set an electric shaver which was continuously operated for two weeks. Thereafter, the electric shaver inner blade was observed for a degree of wear. For those inner blades having different thicknesses, neither delamination of the diamond-like carbon film nor partial cutout thereof at the edges 12a was noticed. The delamination of the protective film or partial cutout thereof at the edges can be prevented by depositing the protective film not only on the sliding surface but also on the region(s) immediately adjacent the sliding surface.

Then, these shavers were used to cut acrylic, artificial hairs. The cut surfaces of hairs were observed to count the proportion thereof that exhibited good cut surfaces. The electric shaver inner blades respectively carrying 1000 Å, 2000 Å and 3000 Å thick, protective films on their sides gave the results of 95%, 80% and 65%, respectively.

It has been found from these results that the cutting quality of electric shaver is reduced as the thickness (3000 Å) of protective film on each side exceeds the thickness (2000 Å) on the sliding surface, i.e., as the ratio d1/d2 falls below 1. This reduced cutting quality of electric shaver is believed likely due to the increased thickness of protective film on the sides relative to the protective film on the sliding surface, which reduces the sharpness of the inner blade edges.

Figure 12:
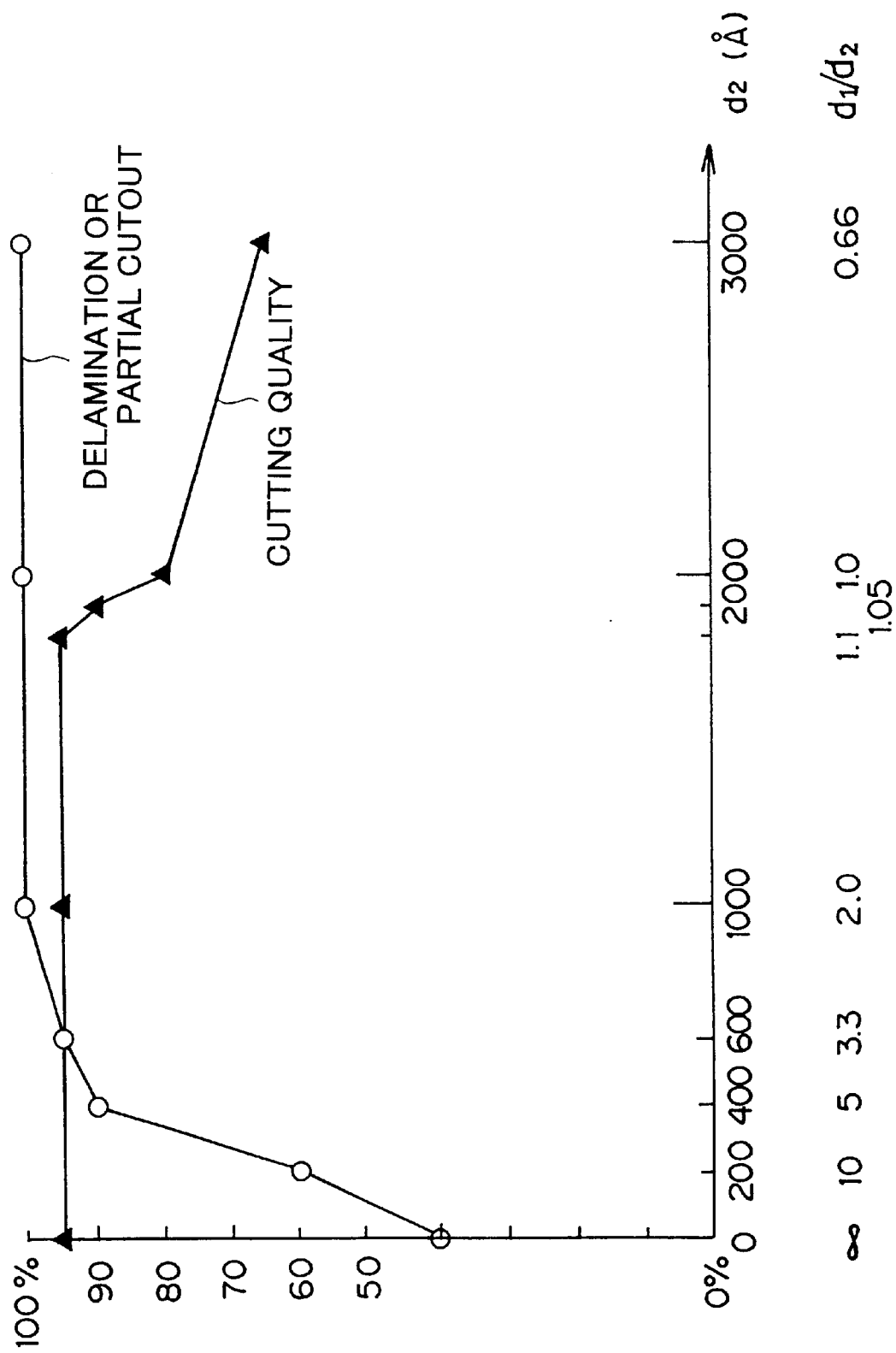
FIG. 12 is a graph showing the level of occurrence of delamination or cutout of a protective film and the level of cutting quality in relation to d1/d2 as varied in one embodiment in accordance with the first aspect of the present invention.

In the same manner as described above, the sample inner blades of electric shaver were fabricated. A diamond-like carbon film was deposited on a sliding surface of each sample inner blade to a thickness of 2000 Å. Also, a diamond-like carbon film was deposited on respective sides of the sample inner blades to the following different thicknesses; 200 Å (d1/d2=10.0), 400 Å (d1/d2=5.0), 600 Å (d1/d2=3.3), 1000 Å (d1/d2=2.0), 1800 Å (d1/d2=1.1), 1900 Å (d1/d2=1.05), 2000 Å (d1/d2=1.0) and 3000 Å (d1/d2= 0.7). These sample inner blades were observed for occurrence of delamination of protective film or partial cutout thereof at the edges of sliding surface, and were also evaluated for cutting qualities thereof in the same manner as described above. The results are given in FIG. 12. In FIG. 12, ○ indicates the degree of occurrence of delamination or partial cutout of the protective film. Fifty samples were prepared for each sample inner blade, and evaluation was made by counting the number of samples, out of fifty samples, that exhibited neither delamination of the protective film nor partial cutout thereof at the edges of sliding surface and determining the rate. Accordingly, 100% indicates that neither delamination of the protective film nor partial cutout thereof at the edges of sliding surface was noticed.

Also, ▲ indicates the level of cutting quality. In the same manner as above, fifty samples were prepared for each sample inner blade. After cutting of acrylic, artificial hairs by using those samples, evaluation was made by counting the number of samples, out of fifty samples, that imparted good cut surfaces to the respective hairs and determining the rate.

As can be appreciated from FIG. 12, the electric shaver inner blade, if its d1/d2 falls within the range of 1.05~5.0, more preferably within the range of 1.1~3.3, exhibits reduced occurrence of delamination or partial cutout of the protective film, as well as an increased level of cutting quality.

Example of Depositing a Hard Carbon Film on an Electric Shaver Outer Blade

Next, a diamond-like carbon film, as a protective film, was formed on an electric shaver outer blade made of Ni. In the same manner as in the above Example, an Si interlayer was formed on each of outer and inner surfaces of the electric shaver outer blade to a thickness of 500 Å. Also in the same manner as described above, the ECR plasma CVD apparatus was employed to form the diamond-like carbon film, through the interlayer, exclusively on the inner surface (including the sliding surface 2) shown in FIG. 6 to a thickness of 2000 Å.

This sample outer blade having the outer surface left uncovered by a diamond-like carbon film was combined with an electric shaver inner blade, made of SUS, to set an electric shaver which was then operated continuously for two weeks. The inner surface of outer blade was subsequently observed for degree of wear. The partial cutouts of the diamond-like carbon film, as the protective film, were noticed at the edges of the sliding surface.

Sample outer blades were then fabricated carrying a diamond-like carbon film not only on the inner surface but also on the outer surface 3 shown in FIG. 6. However, those sample outer blades had 1000 Å, 2000 Å and 3000 Å thick, diamond-like carbon films on their respective outer surfaces.

Each of the sample outer blades thus obtained was combined with an inner blade made of SUS to set an electric shaver for continuous operation, in the same manner as described above. The sample outer blades were observed for degree of wear. None of those sample outer blades showed cutout of protective film at the edges of sliding surface. This demonstrates that the deposition of protective film not only on the sliding surface but also on its adjacent surface regions of the electric shaver outer blade effectively prevents delamination of the protective film, as well as cutout of the protective film at the edges of sliding surface.

The sample outer blades were then subjected to the aforementioned cutting test using artificial hairs. The sample outer blades respectively carrying 1000 Å, 2000 Å and 3000 Å thick protective films on their respective outer surfaces gave the results of 95%, 80% and 65%, respectively. It has been found from these results that as the thickness d2 of protective film on the outer surface exceeds the thickness d1 on the sliding surface within the inner surface, i.e., as the ratio d1/d2 falls below 1, the sharpness of the outer blade is reduced at its edges, resulting in reduced cutting quality of the electric shaver incorporating such an outer blade.

Figure 13:
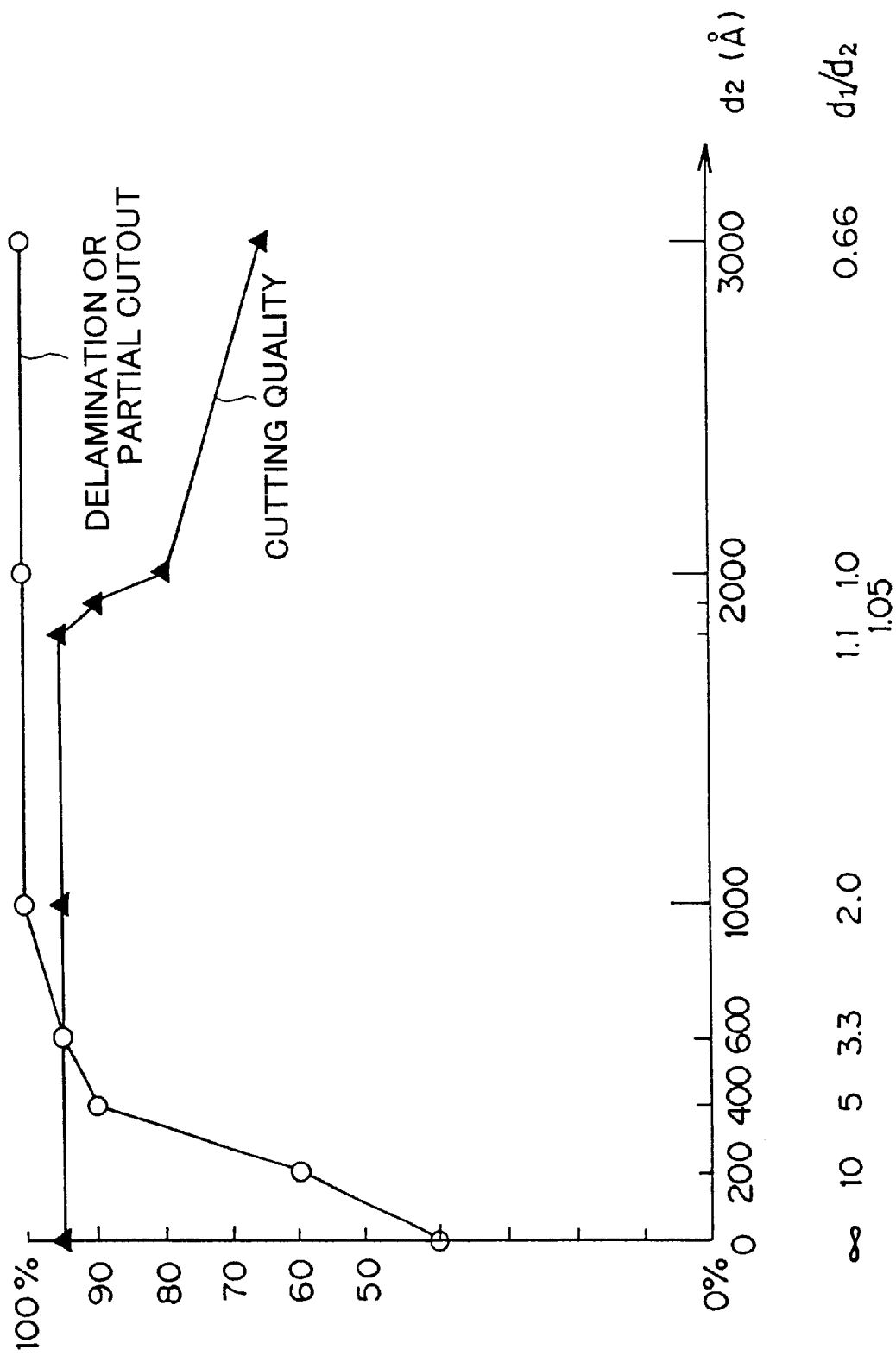
FIG. 13 is a graph showing the level of occurrence of delamination or cutout of a protective film and the level of cutting quality in relation to d1/d2 as varied in another embodiment in accordance with the first aspect of the present invention.

Pursuant to the aforementioned procedures, the outer blade of electric shaver was fabricated. A diamond-like carbon film was deposited on an inner surface of the outer blade to a thickness of 2000 Å. Also, a diamond-like carbon film was deposited on an outer surface of the outer blade to the following different thicknesses; 200 Å (d1/d2=10.0), 400 Å (d1/d2=5.0), 600 Å (d1/d2=3.3), 1000 Å (d1/d2=2.0), 1800 Å (d1/d2=1.1), 1900 Å (d1/d2=1.05), 2000 Å (d1/d2=1.0) and 3000 Å (d1/d2=0.7). The sample outer blades thus obtained were observed for occurrence of delamination of the protective film or partial cutout at the edges of sliding surface, and were also evaluated for a level of cutting quality in the same manner as described above. The results are given in FIG. 13. In FIG. 13, ○ indicates the degree of occurrence of delamination or partial cutout of the protective film. Fifty samples were prepared for each sample outer blade, and evaluation was made by counting the number of samples, out of fifty samples, that exhibited neither delamination of protective film nor partial cutout thereof at the edges of sliding surface and determining the rate. Accordingly, 100% indicates that neither delamination of the protective film nor partial cutout thereof at the edges of sliding surface film was noticed.

Also, ▲ indicates the level of cutting quality. In the same manner as above, fifty samples were prepared for each sample outer blade. After cutting of acrylic, artificial hairs by using the samples, evaluation was made by counting the number of samples, out of fifty samples, that imparted good cut surfaces to the respective hairs and determining the rate.

As can be appreciated from FIG. 13, the electric shaver outer blade, if its d1/d2 falls within the range of 1.05~5.0, more preferably within the range of 1.1~3.3, exhibits reduced occurrence of delamination or partial cutout of its protective film, as well as increased level of cutting quality.

Example of Depositing a Zirconium Nitride (ZrN) Film on an Electric Shaver Outer Blade A ZrN film, as a protective film, was deposited on an electric shaver outer blade made of Ni. In this Example, the ZrN film was deposited directly on the electric shaver outer blade.

Figure 11:
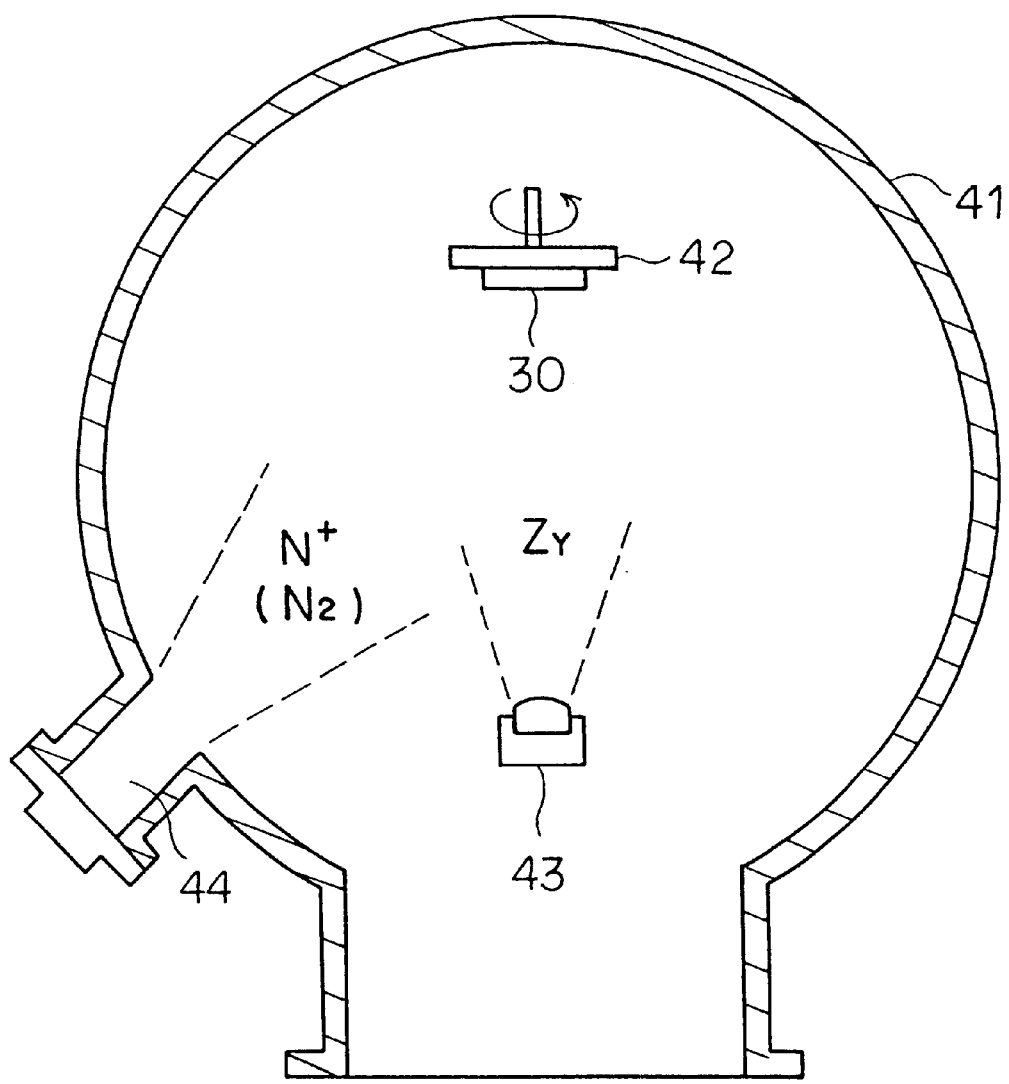
FIG. 11 is a schematic block diagram showing an apparatus for vacuum evaporation and ion implantation, for use in the formation of a ZrN film.

FIG. 11 shows an apparatus for vacuum deposition and ion implantation, for use in the formation of the ZrN film. A vacuum chamber 41 houses a holder 42 which is rotatable in the direction of the shown arrow at a rate of 10~20 rpm. The holder 42 mounts a sample piece 30 thereon. The vacuum chamber 41 is provided with an evaporation source 43 which evaporates zirconium (Zr) atoms for direction onto the sample piece 30. The vacuum chamber is further provided with an assist ion gun 44 which is operable to either emit nitrogen ions ($N^+$) or supply a nitrogen gas ($N_2$) toward the sample piece 30. This ion gun 44, while emitting $N^+$ ions, may also emit nitrogen atoms (N), although slight in amount, which have failed to become ions.

The interior of vacuum chamber 41 is evacuated to a pressure of $10^{-5}$~$10^{-7}$ Torr., followed by supply of an $N_2$ gas into the assist ion gun 44 which emits $N^+$ ions toward a surface of the sample piece 30. The acceleration voltage and ion current density of $N^+$ ions are set at 700 eV and 0.38 mA/cm$^2$, respectively.

Concurrently with the emission of $N^+$ ions by the assist ion gun, the evaporation source 43 is driven to evaporate Zr atoms for direction onto the surface of sample piece 30. The evaporation rate of Zr is controlled to measure 650 Å/min when converted to a film-forming rate on the sample piece 30.

In the procedure as stated above, a ZrN film was first formed solely on an inner surface of an electric shaver outer blade to a thickness of 2000 Å. The sample outer blade thus obtained was combined with an inner blade made of SUS to set an electric shaver for continuous operation, in the same manner as described above. The sample outer blade was observed for degree of wear of protective film provided on a sliding surface within its inner surface. The partial cutout of the protective film were noticed at the edges of sliding surface of the sample outer blade.

Next, a protective film, i.e., a ZrN film was deposited not only on the inner surface but also on an outer surface of the electric shaver outer blade. However, the ZrN film was deposited on the outer surface to different thicknesses; 1000 Å, 2000 Å and 3000 Å.

In the same manner as described above, each sample outer blade thus obtained was combined with an electric shaver inner blade to set an electric shaver for continuous operation. Thereafter, the sample outer blades were observed for degrees of wear at their respective sliding surfaces. None of them showed cutout of protective film at the edges of sliding surface. This demonstrates that the delamination of the protective film or partial cutout of the protective film at the edges of sliding surface can be prevented by depositing a protective film not only on the sliding surface but also on its adjacent, outer surface region around the opening.

Next, the shavers incorporating these sample outer blades were subjected to the cutting test using artificial hairs. The cutting qualities thereof were observed by counting the proportion of hairs which exhibited good cut surfaces. The electric shaver outer blades respectively carrying 1000 Å, 2000 Å and 3000 Å thick, protective films gave the results of 95%, 80% and 65%, respectively.

It has been found from these results that as the thickness d2 of protective film on the outer surface region adjacent the sliding surface is controlled to exceed the thickness d1 thereof on the sliding surface, i.e., as the ratio d1/d2 is controlled to fall below 1, the sharpness of outer blade is reduced at the edges of its sliding surface to result in the reduced cutting quality thereof.

Figure 14:
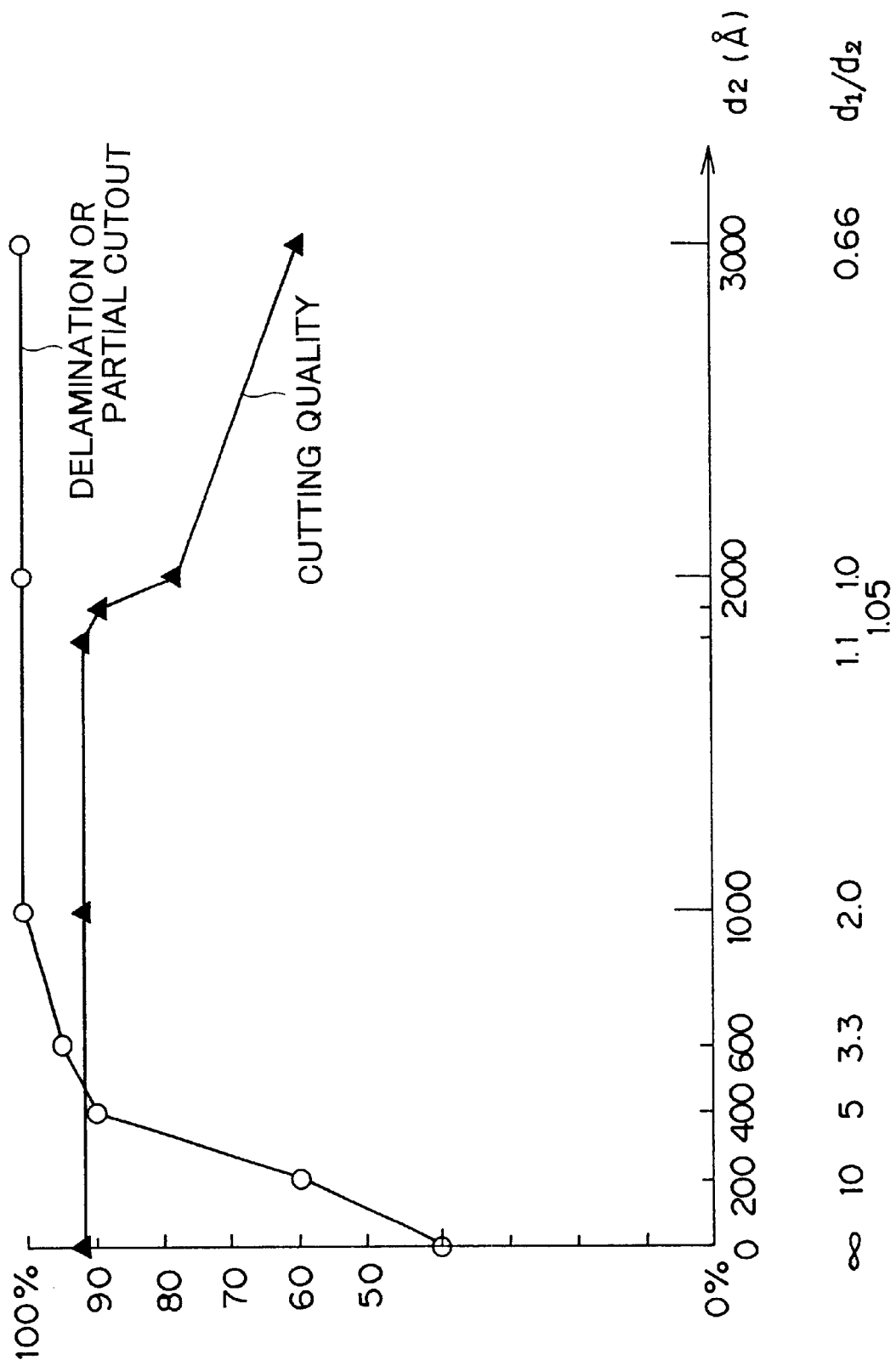
FIG. 14 is a graph showing the level of occurrence of delamination or cutout of a protective film and the level of cutting quality in relation to d1/d2 as varied in a still another embodiment in accordance with the first aspect of the present invention.

In the same manner as described above, a ZrN film was deposited on an inner surface of an electric shaver outer blade to a thickness of 2000 Å. Another ZrN film was formed on an outer surface of the outer blade to the following different thicknesses: 200 Å (d1/d2=10.0), 400 Å (d1/d2=5.0), 600 Å (d1/d2=3.3), 1000 Å (d1/d2=2.0), 1800 Å (d1/d2=1.1), 1900 Å (d1/d2=1.05), 2000 Å (d1/d2=1.0)

and 3000 Å (d1/d2=0.7). In the same manner as described above, the sample outer blades obtained were observed for occurrence of delamination of protective film or partial cutout thereof at the edges of sliding surface, and were also evaluated for cutting quality. The results are given in FIG. 14. In FIG. 14, ○ indicates the degree of occurrence of delamination of protective film or partial cutout thereof at the edges of sliding surface. Fifty samples were prepared for each sample outer blade, and evaluation was made by counting the number of samples, out of fifty samples, which exhibited neither delamination of protective film nor partial cutout thereof at the edges of sliding surface and determining the rate. Accordingly, 100% indicates that neither delamination of protective film nor partial cutout thereof at the edges of sliding surface was noticed.

Also, ▲ indicates the level of cutting quality. In the same manner as described above, fifty samples were prepared for each sample outer blade. After cutting of acrylic, artificial hairs by using the samples, evaluation was made by counting the number of samples, out of fifty samples, which imparted good cut surfaces to the respective hairs and determining the rate.

As can be appreciated from FIG. 14, the electric shaver outer blade, if its d1/d2 falls within the range of 1.05~5.0, more preferably within the range of 1.1~3.3, exhibits the reduced occurrence of delamination or partial cutout of its protective film, as well as increased cutting quality.

The specific examples will be below described which deposit a protective film on an electric shaver outer blade in accordance with the second through fourth aspects of the present invention.

EXAMPLE 1

Figure 24:
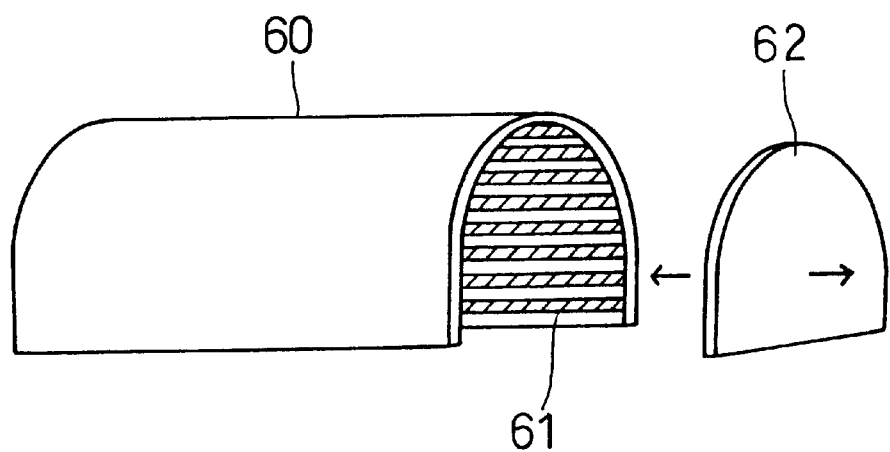
FIG. 24 is a perspective view showing inner and outer blades of an electric shaver for use in one embodiment in accordance with the second aspect of the present invention.

In this Example, a diamond-like carbon film 61, as a protective film, was deposited on an inner surface of an electric shaver outer blade 60 made of Ni, as shown in FIG. 24. The openings provided in the electric shaver outer blade 60 for catching the beard was not shown in FIG. 24. The electric shaver outer blade 60 shown in FIG. 24 assumes the configuration after subjected to bending processing. The protective film was deposited on the inner surface of the electric shaver outer blade 60 while in a plate form. First, a CVD method was employed, analogously to the above Examples, to deposit an Si interlayer on the inner surface of the plate-form, electric shaver outer blade to a thickness of 500 Å.

The plate-form, electric shaver outer blade carrying the interlayer thereon was then placed on a magnet, as shown in FIGS. 17 and 18, which produced a distribution of lines of magnetic force above a surface on which a film is to be deposited. While they were maintained under such a condition, a diamond-like carbon film was deposited on the interlayer by employing the ECR plasma CVD apparatus. The positional arrangement of the electric shaver outer blade was adjusted so that a striped pattern consisting of projected and depressed portions of the deposited protective film 61 extends in the sliding direction of an electric shaver inner blade 62, as shown in FIG. 24. The projected portions of the protective film 61 are indicated by crosshatching in FIG. 24. Since the electric shaver outer blade is formed from a magnetic material, it can be fixed on the magnet 53 by the action of magnetic force.

The protective film provided in the manner as stated above measured an average thickness of 2000 Å. The thinnest depressed portion measured a thickness of 1750 Å. The thickest projected portion measured a thickness of 2250 Å. Accordingly, the difference in height between such projected and depressed portions was 500 Å. A center distance between the depressed and projected portions was about 2 mm.

EXAMPLE 2

In the same manner as in Example, an Si interlayer was formed on an inner surface of the plate-form outer blade of electric shaver to a thickness of 500 Å. A diamond-like carbon film, as a protective film, was further deposited on the interlayer by using the method shown in FIGS. 21 through 23. A 500 Å thick, diamond-like carbon film was deposited to provide a first protective film 57 shown in FIG. 22. A center distance between the neighboring first protective films 57 was controlled at about 4 mm. Another diamond-like carbon film was deposited to provide a second protective film 58 shown in FIG. 23 having a thickness of about 1750 Å. Accordingly, the thickest projected portion 59a of the protective film 59 shown in FIG. 23 measured a thickness of about 2250 Å, while the thinnest depressed portion 59b thereof measured a thickness of 1750 Å. A center distance between the neighboring projected and depressed portions was about 2 mm.

Comparative Example 1

In the same manner as in Example 1, an Si interlayer was formed on an inner surface of the plate-form outer blade of electric shaver to a thickness of 500 Å. Thereafter, the ECR plasma CVD apparatus was employed to deposit a 2000 Å thick, diamond-like carbon film on the interlayer. This diamond-like carbon film was a film substantially uniform in thickness.

The electric shaver outer blades obtained from Examples 1 and 2 and Comparative Example 1 were then subjected to bending processing to impart the shape shown in FIG. 24 thereto. Each electric shaver outer blade was arranged to receive an electric shaver inner blade 62 inside thereof for evaluation of wearability. For comparative purposes, an electric shaver outer blade, carrying neither interlayer nor protective film on its inner surface, was also subjected to the evaluation of wearability (Comparative Example 2).

A load current of a motor when driving the electric shaver inner blade was measured. The evaluation in wearability of the outer blades was given by using relative values when the load current measured in Comparative Example 2 was taken as 1. Also, after the electric shaver inner blade was driven for 50 hours, the respective electric shaver outer blade was removed to visually observe any presence of scratches thereon for evaluation of scratch resistance.

The rating ○ indicates that no scratch was noticed, or scratches were noticed in a limited surface region of the outer blade. The rating Δ indicates that scratches were noticed over an entire surface of the outer blade. The rating × indicates that the outer blade was ultimately fractured.

The evaluation results are given in Table 1.

TABLE 1

| | EX-AM-PLE 1 | EX-AM-PLE 2 | COMPAR-ATIVE EXAMPLE 1 | COMPAR-ATIVE EXAMPLE 2 |
|---|---|---|---|---|
| LOAD CURRENT (RELATIVE VALUE) | 0.7 | 0.7 | 0.8 | 1.0 |
| SCRATCH RESISTANCE | ○ | ○ | Δ | × |

As can be appreciated from the results given in Table 1, the use of electric shaver outer blades of Examples 1 and 2, respectively irregularly-surfaced according to the second aspect of the present invention, results in the reduced load current to the motor, reduced frictional resistance and improved wear resistance. It can also be appreciated that the respective inner surfaces of the electric shaver outer blades of Examples 1 and 2 were imparted thereto excellent scratch resistances.

Initially, the respective inner surfaces of the electric shaver outer blades of Examples 1 and 2 were visually observed as defining a striped pattern reflecting the varied film thickness. However, as the sliding movement of the inner blade continued for a prolonged period, the progressive wear of the protective film on the inner surface was observed which caused the striped pattern to gradually disappear. Accordingly, the observation of such a striped pattern can be helpful in finding the time to replace the outer blade of electric shaver.

Although the above Examples, according to the second aspect of the present invention, describe the deposition of irregularly-surfaced protective film on the inner surface of the electric shaver outer blade, such an irregularly-surfaced protective film may be deposited on an outer surface of the electric shaver outer blade. In this instance, the outer surface is a sliding surface for contact with a human skin.

In the above Examples according to the first and second aspects of the present invention, the present invention is illustrated as being applied to the inner and outer blades of electric shaver. However, the present invention is not limited to such applications, and can also be applied to sliding parts of a compressor such as a rotary compressor, sliding parts of VTR, thin-film magnetic heads, mask screens and the others.

Figure 25:
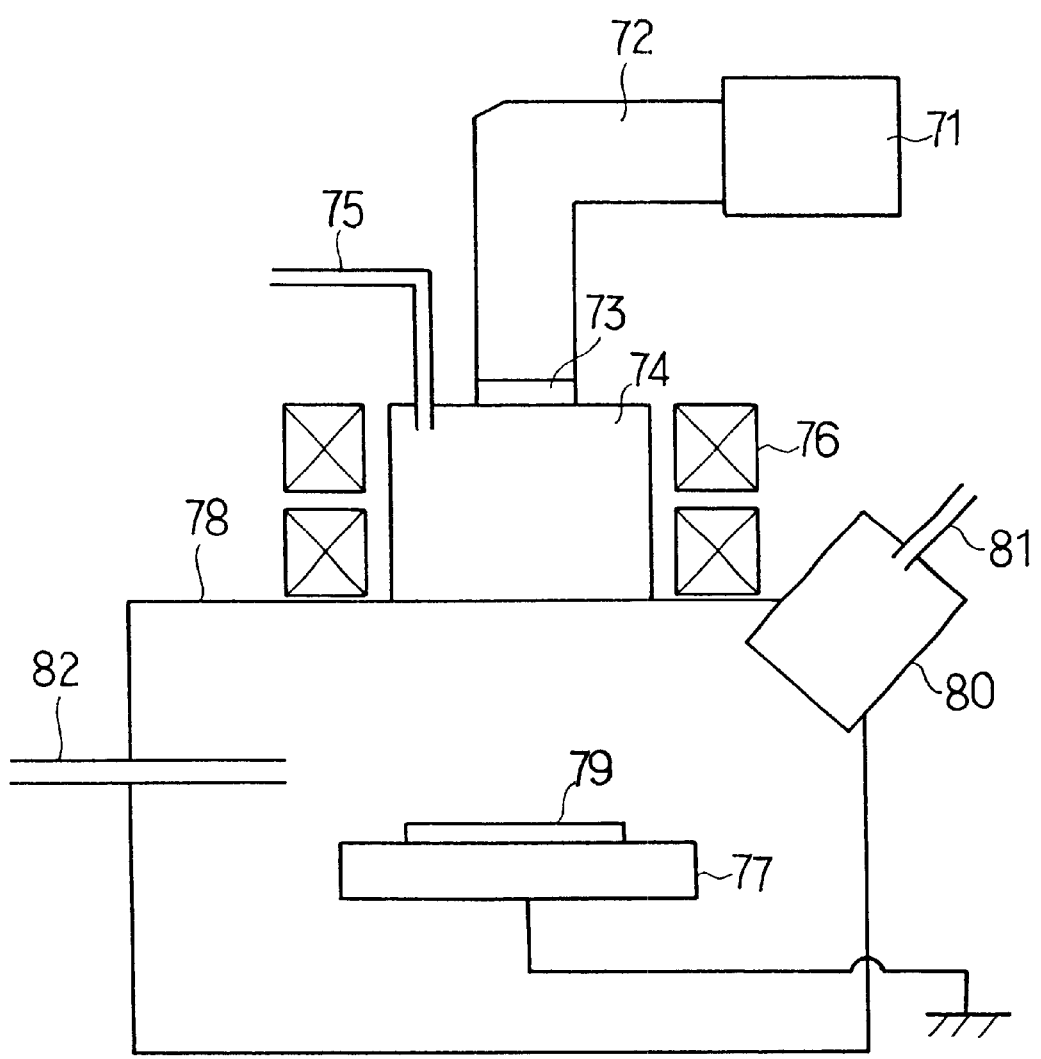
FIG. 25 is a schematic sectional view showing an exemplary ECR plasma CVD apparatus for use in an embodiment for practicing the method in accordance with a fifth aspect of the present invention.

ECR Plasma CVD Apparatus in Accordance with the Fifth Aspect of the Present Invention FIG. 25 is a schematic sectional view showing an ECR plasma CVD apparatus in accordance with the fifth aspect of the present invention. Referring to FIG. 25, a vacuum chamber 78 is provided with a plasma generation chamber 74 to which one end of a waveguide 72 is connected. Another end of the waveguide 72 is mounted to a microwave supplying means 71. A microwave generated in the microwave supplying means 71 passes through the waveguide 72 and a microwave inlet window 73 to be guide into the plasma generation chamber 74. The plasma generation chamber 74 is provided with a gas inlet line 75 for introducing a discharge gas such as an argon (Ar) gas into the plasma generation chamber 74. The vacuum chamber 78 is further provided with a gas inlet line 82 for introducing a source gas, such as methane ($CH_4$), thereinto. A high density ECR plasma can be produced within the plasma generation chamber 74 through the interaction of a radio-frequency magnetic field produced by the microwave and a magnetic field produced by plasma magnetic field generators 76. The vacuum chamber 78 encloses a substrate holder 77 on which a substrate is placed. An ion gun 80 is disposed in a suitable position for emission of an ion beam toward the substrate 79. Connected to this ion gun 80 is a gas inlet line 81 for introducing thereinto a source gas which is to be converted to ions.

EXAMPLE 3

In this Example, the apparatus shown in FIG. 25 is employed to form a diamond-like carbon film, as a first protective film, on which a carbon nitride film is subsequently deposited as a second protective film, in accordance with the fifth aspect of the present invention.

A diamond-like carbon film was first deposited on a substrate by using the ECR plasma CVD method. While the interior of vacuum chamber 78 was evacuated to a pressure of $10^{-5} \sim 10^{-7}$ Torr., an Ar gas was introduced into the plasma generation chamber 74 at a pressure of $2.5 \times 10^{-4}$ Torr. for conversion to an Ar plasma within the plasma generation chamber 74. A source gas, i.e., a $CH_4$ gas at a pressure of $3.0 \times 10^{-4}$ Torr. was supplied to the vacuum chamber 78 in which the $CH_4$ gas was decomposed by the Ar plasma to result in the formation of the diamond-like carbon film on the substrate 79. An Si substrate was employed for the substrate 79. The film-forming rate and film thickness were 800 Å/min and 1200 Å, respectively.

Figure 26:
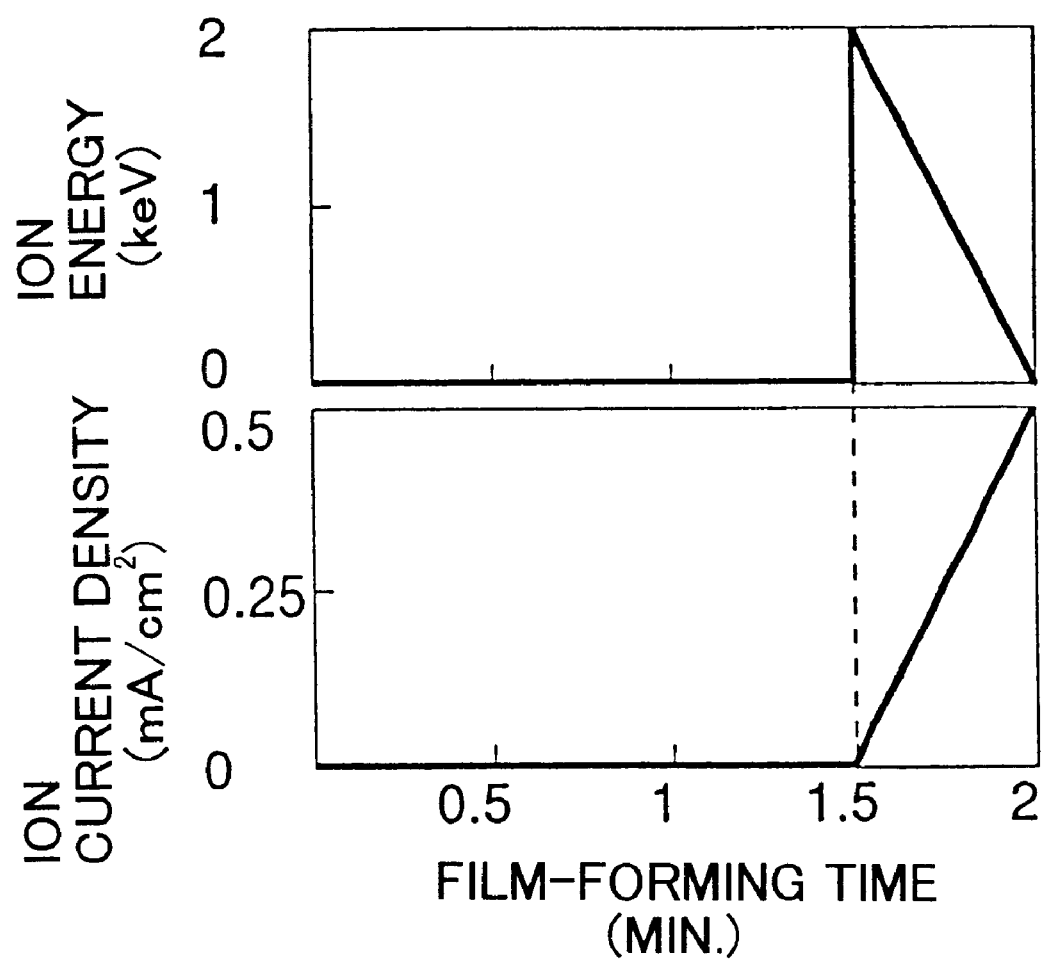
FIG. 26 is a graph showing the variations of ion energy and ion current density with film-forming time, during the deposition of a second film layer, in an embodiment for practicing the method in accordance with the fifth aspect of the present invention.

Next, a nitrogen gas at a pressure of $2 \times 10^{-4}$ Torr. from the gas inlet line 81 was delivered to the ion gun 80 which subsequently emitted nitrogen ions onto the substrate 79, concurrently with the above-described formation of diamond-like carbon film by means of the ECR plasma CVD method. During the emission of nitrogen ions, the ion energy and ion current density were both varied with film-forming time, as shown in FIG. 26. Specifically, the ion energy was decreasingly varied from 2 keV to 0 keV with film-forming time of the second film layer, and the ion current density was increasingly varied from 0 to 0.5 mA/cm$^2$ with film-forming time of the second film layer. In this manner, the formation of second film layer was continued for 0.5 minutes to provide the second film layer having a thickness of 400 Å. As a result, a film was formed including the first and second film layers. The thickness of the film thus totaled 1600 Å.

Figure 27:
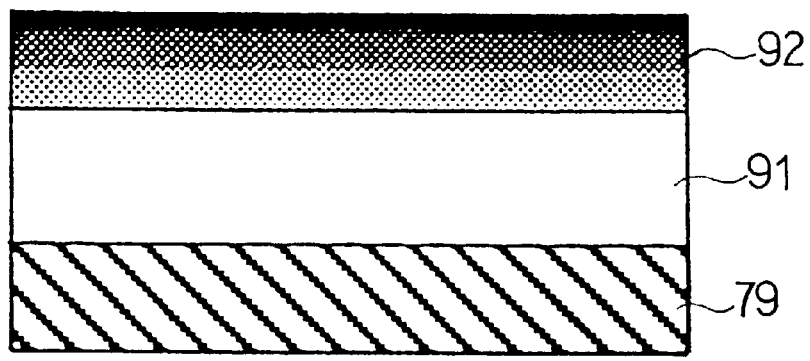
FIG. 27 is a sectional view showing a film embodiment in accordance with the present invention.

FIG. 27 is a sectional view showing the film obtained in the manner as described above. As shown in FIG. 27, the first film layer 91, consisting of the diamond-like carbon film, is deposited on the substrate 79, and the second film layer 92, consisting of the carbon nitride (CN) film, is deposited on the first film layer 91.

Figure 28:
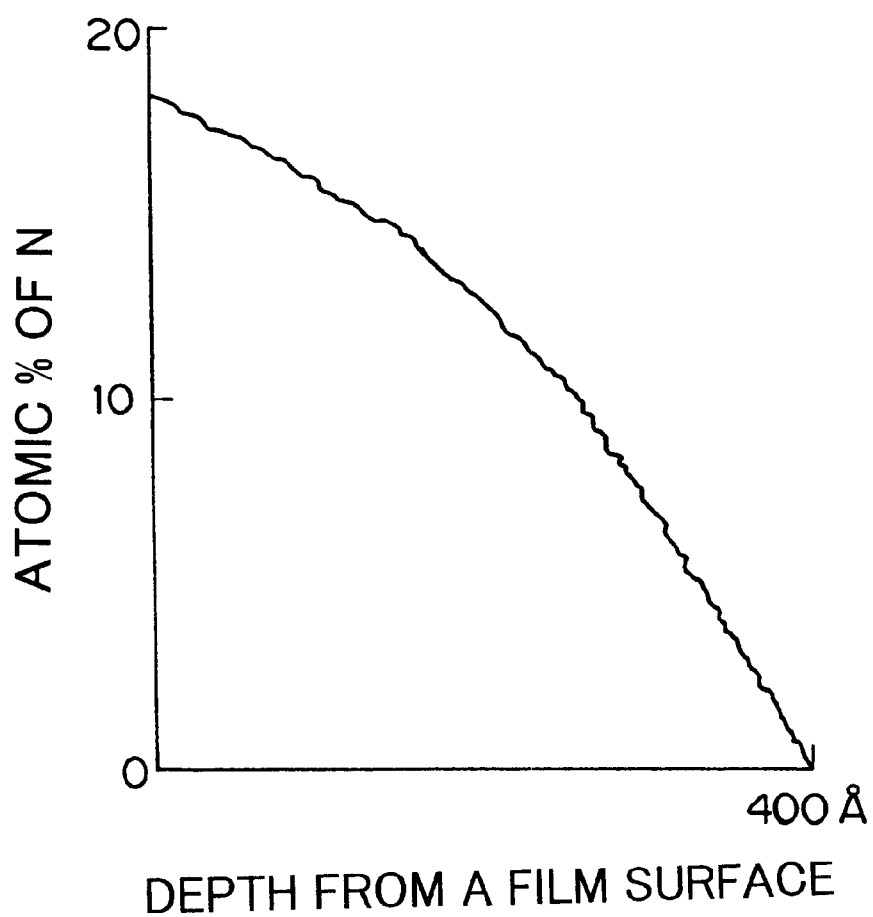
FIG. 28 is a graph showing a distribution of nitrogen concentration in a thickness direction of a second film layer incorporated in the film embodiment in accordance with the present invention.

FIG. 28 is a graph showing the analytical results of the second film layer 92 when subjected to the secondary mass ion spectrometry (SIMS). As can be appreciated from FIG. 28, the second film layer has an increased nitrogen content toward its surface so that a concentration gradient of nitrogen is produced in its thickness direction.

The samples obtained were then evaluated for adherence. In evaluating the adherence, a constant load (2 kg) indentation test was conducted using a Vickers penetrator. Fifty samples were subjected to the test, and the number of samples that showed delamination of the film from the respective substrata was counted as indicating the level of adherence. For comparative purposes, an $N_2$ gas at $4 \times 10^{-4}$ Torr., together with a $CH_4$ gas, were simultaneously introduced from the gas inlet line 82. The ECR plasma CVD method was exclusively utilized to deposit a carbon nitride film on a substrate to a thickness of 1600 Å (Comparative Example 3-1). The samples obtained in Comparative Example 3-1 were likewise subjected to the indentation test using a Vickers penetrator for evaluation of adherence.

As a result, the number of samples that showed delamination amounted to 0 in Example 3 but to 40 in Comparative Example 3-1. These results demonstrate that the formation of carbon nitride film, i.e. the second film layer, on the diamond-like carbon film, i.e. the first film layer, improves adherence of the resulting film to the substrate.

Next, the films respectively obtained in Example 3 and Comparative Example 3-1 were measured for hardness. For comparative purposes, only the above procedure to form the first film layer was followed to solely form a diamond-like carbon film on a substrate to a thickness of 1600 Å (Comparative Example 3-2). Like the above, the film obtained in Comparative Example 3-2 was measured for hardness.

The hardness of the film obtained in Comparative Example 3-1, i.e., the hardness of the amorphous carbon nitride film measured about 2500 Hv, while that of the film obtained in Example 3 measured 3400 Hv. The hardness of the film obtained in Comparative Example 3-2 measured 3500 Hv. These measurement results demonstrate that a film, if constructed by depositing the carbon nitride film, as the second film layer, on the diamond-like carbon film, as the first film layer, is capable of exhibiting the level of hardness almost comparable to that of the diamond-like film.

Next, the films respectively obtained in Example 3 and Comparative Example 3-2 were measured for coefficient of friction. The film of Comparative Example 3-2, a surface of which was defined by the diamond-like carbon film, exhibited a frictional coefficient of 0.18, while the film of Example 3 exhibited a noticeably reduced frictional coefficient of 0.13.

Figure 29:
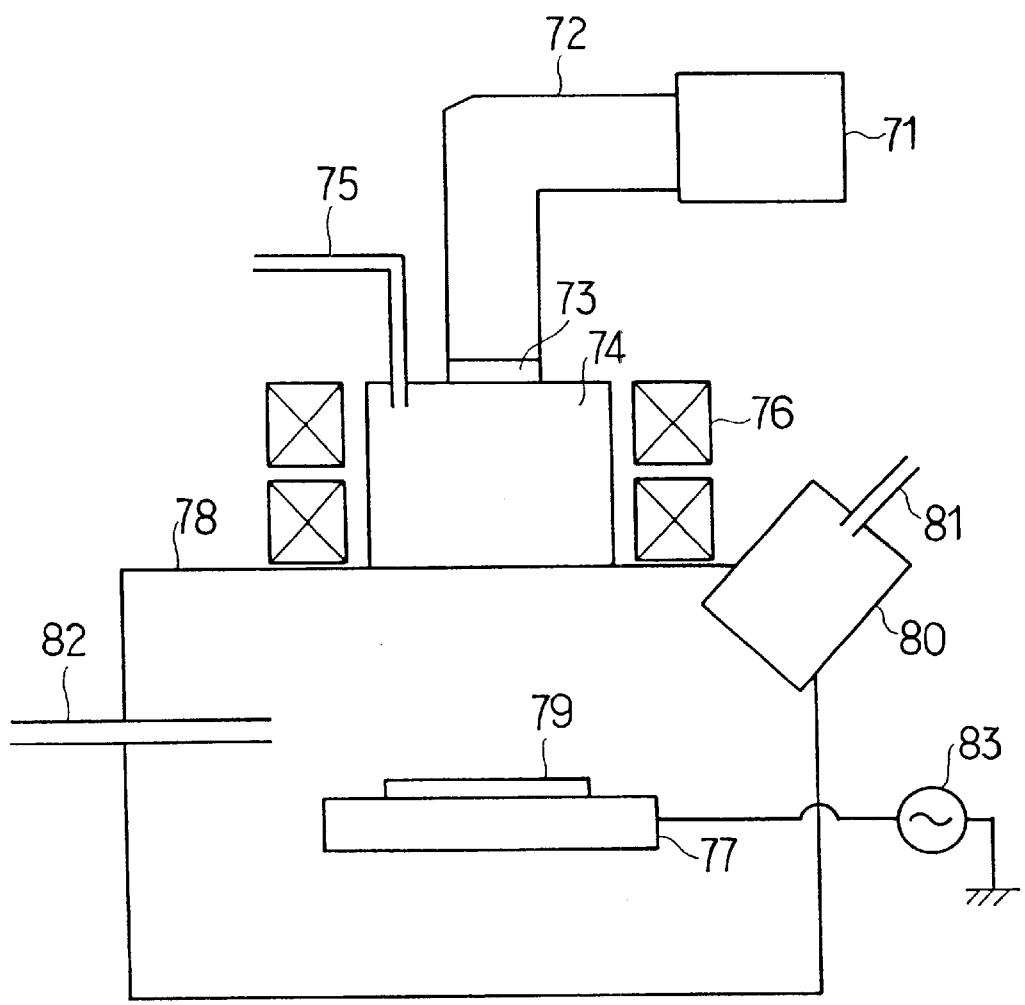
FIG. 29 is a schematic sectional view showing an exemplary ECR plasma CVD apparatus for use in an embodiment for practicing the method in accordance with a sixth aspect of the present invention.

ECR Plasma CVD Apparatus in Accordance with the Sixth Aspect of the Present Invention FIG. 29 is a schematic sectional view showing an ECR plasma CVD apparatus in accordance with the sixth aspect of the present invention. This apparatus is analogous in construction to the apparatus shown in FIG. 25, with the exception that a radio-frequency power source 83 is electrically connected to the substrate holder 77 for applying a radio-frequency power to the substrate holder 77. Accordingly, the detailed discussion of the present apparatus is omitted.

EXAMPLE 4

In this Example, the apparatus shown in FIG. 29 is employed to form a diamond-like carbon film, as a first film layer, on which a carbon nitride film is subsequently formed as a second film layer.

First, the interior of vacuum chamber 78 was evacuated to a pressure of $10^{-5} \sim 10^{-7}$ Torr. Then, an Ar gas at a pressure of $2.5 \times 10^{-4}$ Torr. was introduced into the plasma generation chamber 74 to produce an Ar plasma within the plasma generation chamber 74. A source gas, i.e., a $CH_4$ gas at a pressure of $3.0 \times 10^{-4}$ Torr. was supplied to the vacuum chamber 78 in which the $CH_4$ gas was subsequently decomposed by the Ar plasma to result in the formation of the diamond-like carbon film on the substrate 79. While the formation of first film layer was continued for 1.5 minutes, a 13.56 MHZ radio-frequency power from the radio-frequency power source 83 was applied to the substrate holder so that a substrate was maintained at a bias voltage of −50 V. The film-forming rate was 800 Å/min and the thickness of first film layer was 1200 Å.

Figure 30:
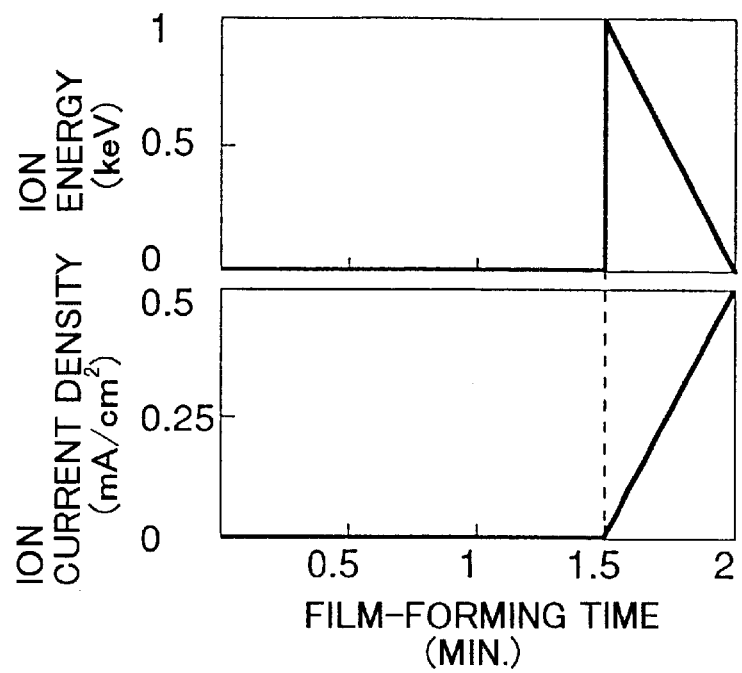
FIG. 30 is a graph showing the variations of ion energy and ion current density with film-forming time, during the deposition of the second film layer, in the embodiment for practicing the method in accordance with the sixth aspect of the present invention.
Figure 31:
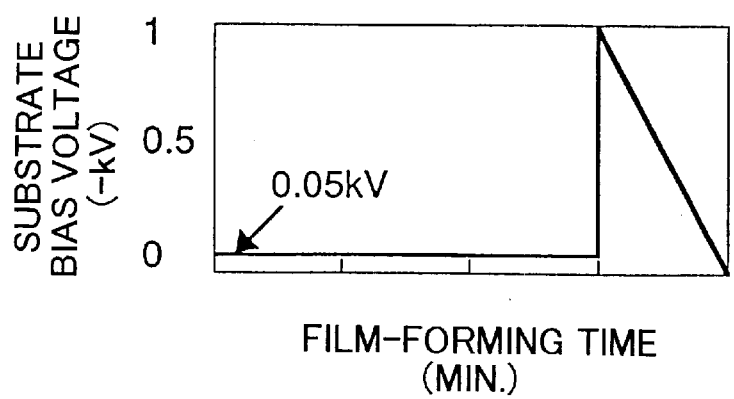
FIG. 31 is a graph showing the variation of substrate bias voltage with film-forming time, during the deposition of the second film layer, in the embodiment for practicing the method in accordance with the sixth aspect of the present invention.

Next, a nitrogen gas at a pressure of $2.5 \times 10^{-4}$ Torr. from the gas inlet line 81 was delivered to the ion gun 80 which emitted nitrogen ions onto the substrate 79, concurrently with the above-described formation of diamond-like carbon film. The formation of second film layer was continued for 0.5 minutes to provide the second film layer, i.e., the carbon nitride film having a thickness of 400 Å. As a result, a film was formed including the first and second film layers. The thickness of the film thus totaled 1600 Å. During the formation of second film layer, the ion energy was decreasingly varied from 1 keV to 0 keV while the ion current density was increasingly varied from 0 to 0.5 mA/cm², as shown in FIG. 30. Concurrently, a substrate bias voltage was varied from −1 kV to 0 kV, as shown in FIG. 31. This resulted in the formation of second film layer which, analogous to the second film layer formed in Example 3, had an increased nitrogen content toward its surface so that a concentration gradient of nitrogen was produced in its thickness direction.

The samples obtained were then evaluated for adherence. In evaluating the adherence, a constant load (2 kg) indentation test was conducted using a Vickers penetrator. Fifty samples were subjected to the test and the number of samples that showed delamination of the film from the respective substrata was counted as indicating the level of adherence. For comparative purposes, an $N_2$ gas at $4 \times 10^{-4}$ Torr., as well as a $CH_4$ gas, were simultaneously introduced from the gas inlet line 82. The ECR plasma CVD method was exclusively utilized to form a carbon nitride film on a substrate to a thickness of 1600 Å (Comparative Example 4-1). The samples obtained in Comparative Example 4-1 were likewise subjected to the indentation test using a Vickers penetrator for evaluation of adherence.

As a result, the number of samples that showed delamination amounted to 0 in Example 4 but to 40 in Comparative Example 4-1. These results demonstrate that the deposition of carbon nitride film, as the second film layer, on the diamond-like carbon film, as the first film layer, improves the adherence of the resulting film to the substrate.

Next, the films respectively obtained in Example 4 and Comparative Example 4-1 were measured for hardness. For comparative purposes, only the aforementioned procedure to form the first film layer was followed to solely form a diamond-like carbon film on a substrate to a thickness of 1600 Å (Comparative Example 4-2). The film obtained in Comparative Example 4-2 was likewise measured for hardness.

The hardness of the film obtained in Comparative Example 4-1, i.e., the hardness of the amorphous carbon nitride film measured about 2500 Hv, while that of the film obtained in Example 4 measured 3400 Hv. The hardness of the film obtained in Comparative Example 4-2 measured 3500 Hv. These measurement results demonstrate that a film, if constructed by depositing the carbon nitride film, as the second film layer, on the diamond-like carbon film, as the first film layer, is capable of exhibiting the level of hardness almost comparable to that of the diamond-like film.

Next, the films respectively obtained in Example 4 and Comparative Example 4-2 were measured for coefficient of friction. The film of Comparative Example 4-2, a surface of which was defined by the diamond-like carbon film, exhibited a frictional coefficient of 0.18, while the film of Example 4 exhibited a noticeably reduced frictional coefficient of 0.13.

EXAMPLE 5

The apparatus shown in FIG. 29 is employed to form a diamond-like carbon film, as a first film layer, on which a carbon nitride film is subsequently formed as a second film layer, in accordance with the seventh aspect of the present invention. In the present Example, the ion gun 80 in the apparatus shown in FIG. 29 is unemployed.

First, the interior of vacuum chamber 78 was evacuated to a pressure of $10^{-5} \sim 10^{-7}$ Torr. Then, an Ar gas at a pressure of $2.5 \times 10^{-4}$ Torr. was introduced into the plasma generation chamber 74 to produce an Ar plasma within the plasma generation chamber 74. A source gas, i.e., a $CH_4$ gas at $3.0 \times 10^{-4}$ Torr. was supplied to the vacuum chamber 78 within which the $CH_4$ gas was decomposed by the Ar plasma to result in the formation of the diamond-like carbon film on the substrate 79. While the formation of first film layer was continued for 1.5 minutes, a radio-frequency power from the radio-frequency power source 83 was applied to the substrate holder 77 so that a substrate was maintained at a bias voltage of −50 V. In the manner as described above, the first film layer was formed at a film-forming rate of 800 Å/min to a thickness of 1200 Å.

Figure 32:
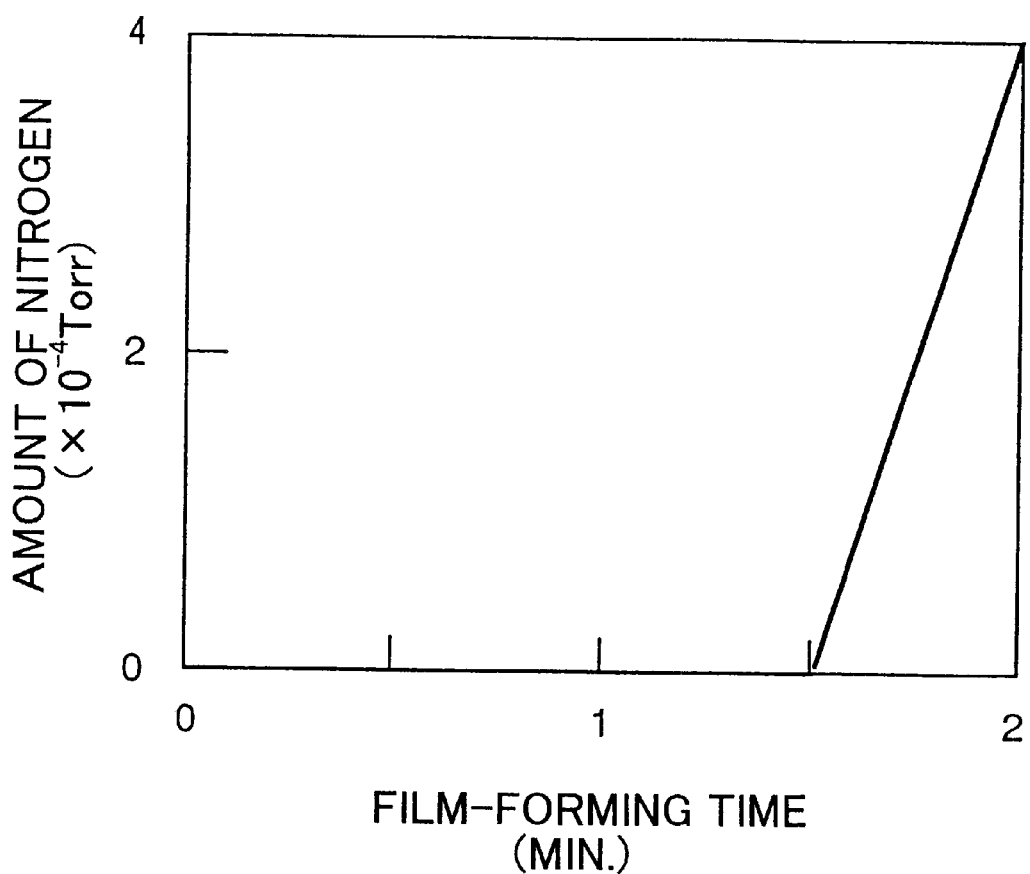
FIG. 32 is a graph showing the variation of nitrogen amount with film-forming time, during the deposition of a second film layer, in an embodiment for practicing the method in accordance with a seventh aspect of the present invention.

A nitrogen gas as a second source gas, together with a $CH_4$ gas, were delivered to the vacuum chamber from the gas inlet line 82. A second film layer, i.e., a carbon nitride film was deposited on the above-formed first film layer by the ECR plasma CVD technique using the mixed gas composed of $CH_4$ and nitrogen gases. The formation of second film layer was continued for 0.5 minutes to provide the carbon nitride film having a thickness of 400 Å. As a result, a film was formed including the first and second film layers. The thickness of the film thus totaled 1600 Å. During the formation of second film layer, the supply pressure of nitrogen gas, as the second source gas, was controlled to gradually increase from 0 to $4\times10^{-4}$ Torr., as shown in FIG. 32.

This resulted in the formation of second film layer which, analogous to the second film layers respectively formed in Examples 3 and 4, exhibited an increased nitrogen content toward its surface so that a concentration gradient of nitrogen was produced in its thickness direction.

The samples obtained were then evaluated for adherence. In evaluating the adherence, a constant load (2 kg) indentation test was conducted using a Vickers penetrator. Fifty samples were subjected to the test and the number of samples that showed delamination of the film from the substrata was counted as indicating the level of adherence. For comparative purposes, an $N_2$ gas at $4\times10^{-4}$ Torr., together with a $CH_4$ gas, were simultaneously introduced from the gas inlet line 82. The ECR plasma CVD method was exclusively utilized to deposit a carbon nitride film on a substrate to a thickness of 1600 Å (Comparative Example 5-1). The samples obtained in Comparative Example 5-1 were likewise subjected to the indentation test using a Vickers penetrator for evaluation of adherence.

As a result, the number of samples that showed delamination amounted to 0 in Example 5 but to 40 in Comparative Example 5-1. These results demonstrate that the deposition of carbon nitride film, as the second film layer, on the diamond-like carbon film, as the first film layer, improves the adherence of the resulting film to the substrate.

Next, the films respectively obtained in Example 5 and Comparative Example 5-1 were measured for hardness. For comparative purposes, only the aforementioned procedure to form the first film layer was followed to solely form a diamond-like carbon film on a substrate to a thickness of 1600 Å (Comparative Example 5-2). The film obtained in Comparative Example 5-2 was likewise measured for hardness.

The hardness of the film obtained in Comparative Example 5-1, i.e., the hardness of the amorphous carbon nitride film measured about 2000 Hv, while that of the film obtained in Example 5 measured 3200 Hv. The hardness of the film obtained in Comparative Example 5-2 measured 3500 Hv. These measurement results demonstrate that a film, if constructed according to the present invention, i.e., by depositing the carbon nitride film, as the second film layer, on the diamond-like carbon film, as the first film layer, is capable of exhibiting the level of hardness almost comparable to that of the diamond-like film.

Next, the films respectively obtained in Example 5 and Comparative Example 5-2 were measured for coefficient of friction. The film of Comparative Example 5-2, a surface of which was defined by the diamond-like carbon film, exhibited a frictional coefficient of 0.18, while the film of Example 5 exhibited a noticeably reduced frictional coefficient of 0.14.

EXAMPLE 6

In this Example, the apparatus shown in FIG. 25 is employed to form a diamond-like carbon film, as a first protective film, on which a carbon nitride film is subsequently deposited as a second protective film, in accordance with the fifth aspect of the present invention.

In the same manner as in Example 3, a first film layer, i.e., a diamond-like carbon film was first formed to a thickness of 1200 Å.

Figure 33:
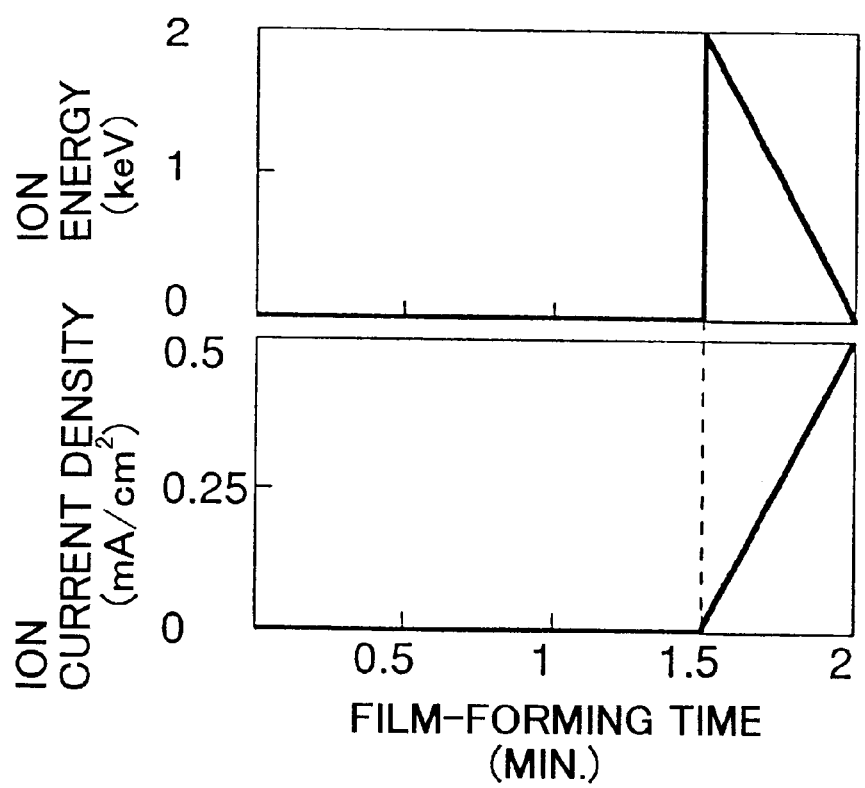
FIG. 33 is a graph showing the variations of ion energy and ion current density with film-forming time, during the deposition of the second film layer, in another embodiment for practicing the method in accordance with the fifth aspect of the present invention.

Next, a silane gas at a pressure of $2\times10^{-4}$ Torr. from the gas inlet line 81 was delivered to the ion gun 80, resulting in the deposition of a carbon silicide film, as a second film layer, on the first film layer. During the formation of second film layer, the ion energy was decreasingly varied while the ion current density was increasingly varied, respectively with film-forming time, as shown in FIG. 33. In this manner, the formation of second film layer was continued for 0.5 minutes to provide the carbon silicide film having a thickness of 400 Å. As a result, a film was formed including the first and second film layers. The thickness of the film thus totaled 1600 Å.

Figure 34:
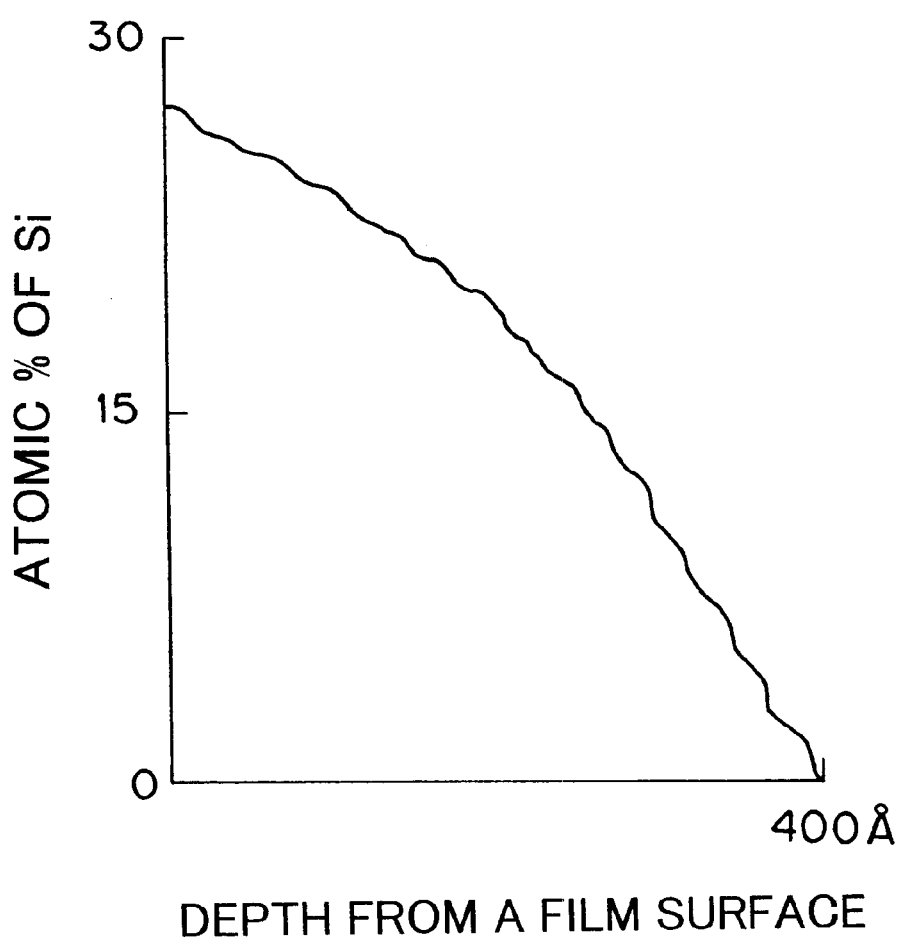
FIG. 34 is a graph showing a distribution of Si concentration in a thickness direction of a second film layer incorporated in another film embodiment in accordance with the present invention.

In the same manner as in Example 3, the second film layer of each sample obtained was analyzed by using the secondary mass ion spectrometry (SIMS). As can be appreciated from FIG. 34, the second film layer had an increased Si content toward its surface so that a concentration gradient of Si was produced in its thickness direction.

The samples obtained were then evaluated for adherence. In evaluating the adherence, a constant load (2 kg) indentation test was conducted using a Vickers penetrator. Fifty samples were subjected to the test and the number of samples that showed delamination of the film from the respective substrata was counted as indicating the level of adherence. For comparative purposes, a silane gas at $1.0\times10^{-4}$ Torr., together with a $CH_4$ gas, were introduced from the gas inlet line 82. The ECR plasma CVD method was exclusively utilized to deposit a carbon silicide film on a substrate to a thickness of 1600 Å (Comparative Example 6-1). Likewise, the samples obtained in Comparative Example 6-1 were subjected to the indentation test using a Vickers penetrator for evaluation of adherence.

As a result, the number of samples that showed delamination amounted to 0 in Example 6 but to 40 min Comparative Example 6-1. These results demonstrate that the deposition of the carbon silicide film, as the second film layer, on the diamond-like carbon film, as the first film layer, in accordance with the present invention, improves the adherence of the resulting film to the substrate.

Next, the films respectively obtained in Example 6 and Comparative Example 6-1 were measured for hardness. For comparative purposes, only the above procedure to form the first film layer was followed to solely form a diamond-like carbon film on a substrate to a thickness of 1600 Å (Comparative Example 6-2). Like the above, the film obtained in Comparative Example 3-2 was measured for hardness.

The hardness of the film obtained in Comparative Example 6-1, i.e., the hardness of the amorphous carbon silicide film measured about 2400 Hv, while that of the film obtained in Example 6 measured 3400 Hv. The hardness of the film obtained in Comparative Example 6-2 measured 3500 Hv. These measurement results demonstrate that a film, if constructed by depositing the carbon silicide film, as the second film layer, on the diamond-like carbon film, as the first film layer, is capable of exhibiting the level of hardness almost comparable to that of the diamond-like film.

Next, the films respectively obtained in Example 6 and Comparative Example 6-2 were measured for coefficient of friction. The film of Comparative Example 6-2, a surface of which was defined by the diamond-like carbon film, exhibited a frictional coefficient of 0.18, while the film of Example 6 exhibited a noticeably reduced frictional coefficient of 0.10.

As stated above, a film, if constructed by depositing the carbon nitride or carbon silicide film, as the second film layer, on the diamond-like carbon film as the first film layer, can be functional to exhibit an improved adhesion to the substrate, a higher degree of hardness and a reduced coefficient of friction.

In the above Examples, the CH4 gas is used as a source gas to form the a diamond-like carbon film which constitutes the first film layer. In depositing the second film layer, the nitrogen and silicon ions are further directed onto the first film layer to deposit the carbon nitride or carbon silicide film thereon. It has been found, however, that the same effect can be obtained by directing a carbon gas onto the first film layer to deposit the second film layer thereon. That is, another diamond-like carbon film can be deposited as the second film layer, which has an increased level of hardness compared to the first film layer.

Also, in depositing the second film layer, the mixed ions, composed of nitrogen and oxygen ions, may be directed onto the first film layer to deposit thereon an oxygen-containing carbon nitride film which also exhibits an increased level of hardness and a reduced coefficient of friction.

Although the ion irradiation is used in the above Examples to deposit the second film layer, a radical irradiation may alternatively be used to obtain the same effect. The radical irradiation can be effected by using a radical gun, for example.

The films of the present invention, including those formed by using the film-forming methods in accordance with the fifth through seventh aspects of the present invention, can be employed to constitute protective films for sliding parts such as inner and outer blades of an electric shaver, and for sliding parts such as of a VTR and a compressor including a rotary compressor. They are also applicable for a protective film as a constituent layer of an solar cell, a protective film for sliding parts of a film magnetic head, a propagation film of an SAW device, or a film for a sensor.

The delamination or cutout of the protective film on the sliding surface can be prevented if the value d1/d2, which is the ratio of the thickness d1 of protective film overlying the sliding surface to the thickness d2 of protective film overlying the surface region immediately adjacent the sliding surface, is controlled to be 1 or greater in accordance with the first aspect of the present invention.

In accordance with the second aspect of the present invention, a reduced coefficient of friction and an improved wear-resistance can be imparted to the protective film.

In accordance with the third and fourth aspects of the present invention, the irregularly-surfaced protective film according to the second aspect of the present invention can be formed efficiently.

In accordance with the fifth through seventh aspects of the present invention, the film having the desired functions and adhering well to the substrate can be formed by using the plasma CVD method.

What is claimed is:

1. An electric shaver outer blade having at least one bore formed therein defining a hole for catching a beard, and a sliding surface for sliding contact with an electric shaver inner blade on an inner surface region around said hole for catching the beard, said sliding surface projecting toward said inner blade and having a protective film deposited not only on said sliding surface but also on an outer surface region around said hole in such a manner that d1/d2 is controlled to be within a range of 1.1–3.3 where d1 is a thickness of the protective film deposited on the sliding surface and d2 is a thickness of the protective film deposited on said outer surface region, the protective film comprising a hard carbon film formed of a diamond and/or amorphous carbon containing a diamond structure and wherein the protective film having a thickness d1 is disposed across the entire sliding surface of the outer blade during operation, said entire sliding surface being flat.

2. An electric shaver inner blade having at a distal end a sliding surface for sliding contact with an electric shaver outer blade, said inner blade having a protective film deposited not only on said sliding surface but also on a side region immediately adjacent said sliding surface in such a manner that d1/d2 is controlled to be within a range of 1.1–3.3, where d1 is a thickness of the protective film deposited on the sliding surface and d2 is a thickness of the protective film deposited on the side region immediately adjacent the sliding surface, the protective film comprising a hard carbon film formed of diamond and/or amorphous carbon containing a diamond structure and wherein the protective film having a thickness d1 is disposed across the entire sliding surface of the inner blade during a shaving operation.

3. A sliding member having a sliding surface for sliding contact with a cooperative member, said sliding member having a protective film deposited not only on said sliding surface but also on a surface region immediately adjacent the sliding surface in such a manner that d1/d2 is controlled to be within a range of 1.1–3.3, where d1 is a thickness of the protective film deposited on the sliding surface and d2 is a thickness of the protective film deposited on the surface region immediately adjacent the sliding surface, the protective film comprising a hard carbon film formed of diamond and/or amorphous carbon containing a diamond structure and wherein the protective film having a thickness d1 is disposed across the entire sliding surface of the sliding member during a sliding operation.

4. The sliding member of claim 3, wherein said protective film has a hardness of not less than 1000 Hv.

5. The sliding member of claim 3, wherein said surface region adjacent the sliding surface is on a surface angularly oriented with respect to the sliding surface.

* * * * *